United States Patent [19]

Shimizu et al.

[11] 4,293,950
[45] Oct. 6, 1981

[54] TEST PATTERN GENERATING APPARATUS

[75] Inventors: Masao Shimizu; Takashi Tokuno, both of Gyoda; Kohji Ishikawa, Funabashi; Naoaki Narumi, Tokyo; Osamu Ohguchi, Sayama, all of Japan

[73] Assignees: Nippon Telegraph and Telephone Public Corporation; Takeda Riken Kogyo Kabushikikaisha, both of Tokyo, Japan

[21] Appl. No.: 26,246

[22] Filed: Apr. 2, 1979

[30] Foreign Application Priority Data

| Apr. 3, 1978 | [JP] | Japan | 53-038949 |
| Apr. 3, 1978 | [JP] | Japan | 53-038950 |
| Apr. 3, 1978 | [JP] | Japan | 53-038951 |
| Apr. 3, 1978 | [JP] | Japan | 53-038952 |
| May 18, 1978 | [JP] | Japan | 53-059381 |
| May 18, 1978 | [JP] | Japan | 53-059382 |
| May 18, 1978 | [JP] | Japan | 53-059383 |
| Oct. 13, 1978 | [JP] | Japan | 53-126523 |
| Oct. 30, 1978 | [JP] | Japan | 53-133936 |

[51] Int. Cl.³ .................... G06F 11/00; G01R 31/28
[52] U.S. Cl. .................... 371/21; 324/73 R; 371/27
[58] Field of Search .................. 371/21, 24, 27, 20; 364/200, 900; 324/73 R, 73 AT

[56] References Cited

U.S. PATENT DOCUMENTS

| 3,751,649 | 8/1973 | Hart, Jr. ................... 371/21 |
| 3,969,618 | 7/1976 | Strubel et al. ............ 371/21 |
| 4,066,882 | 1/1978 | Esposito .................. 324/73 R |
| 4,168,527 | 9/1979 | Winkler .................... 371/20 |

*Primary Examiner*—Charles E. Atkinson
*Attorney, Agent, or Firm*—Staas & Halsey

[57] ABSTRACT

A test pattern generating apparatus in which a microprogram describing a test pattern to be generated is read for interpretation and execution, address and data patterns are generated by arithmetic operations and a memory control signal is produced, the address and data patterns and the memory control signal being applied to a memory under test. The address pattern is provided to an area inversion control signal generation section to produce an inversion control signal corresponding to the address pattern, by which the data pattern may be inverted and then outputted.

21 Claims, 49 Drawing Figures

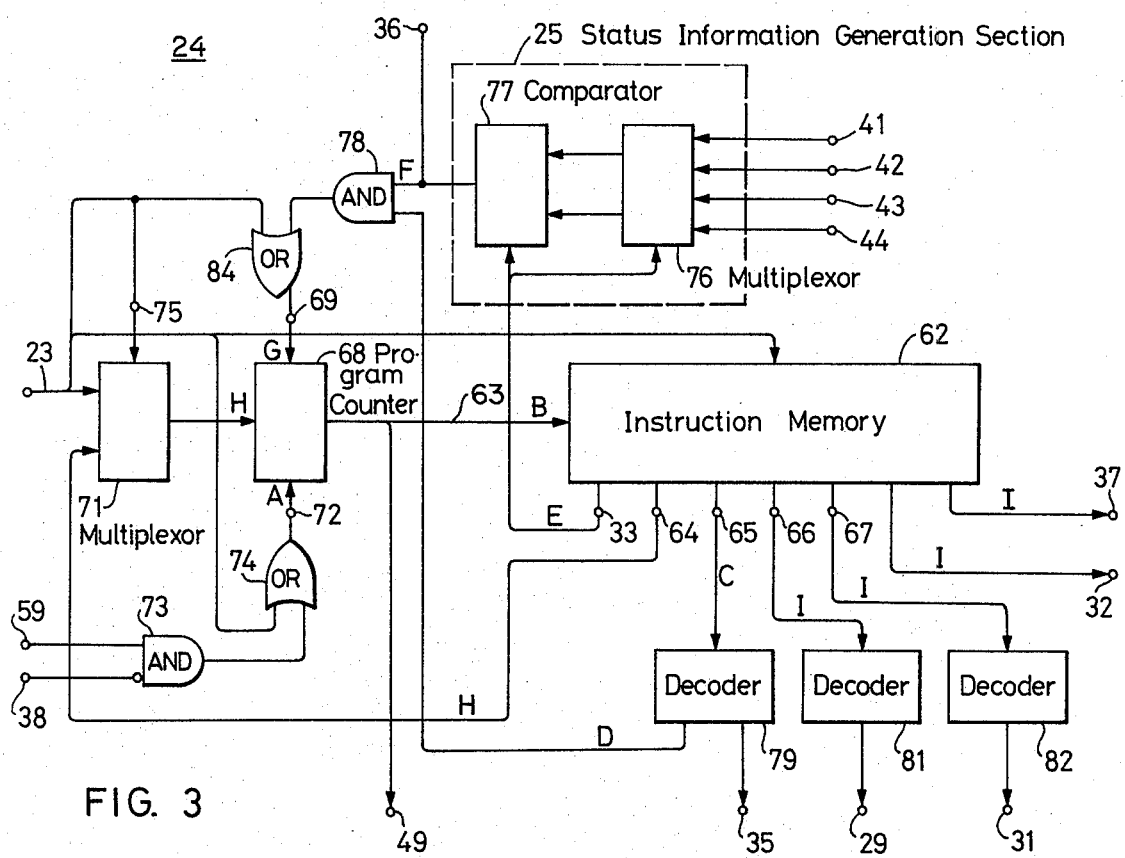
FIG. 3
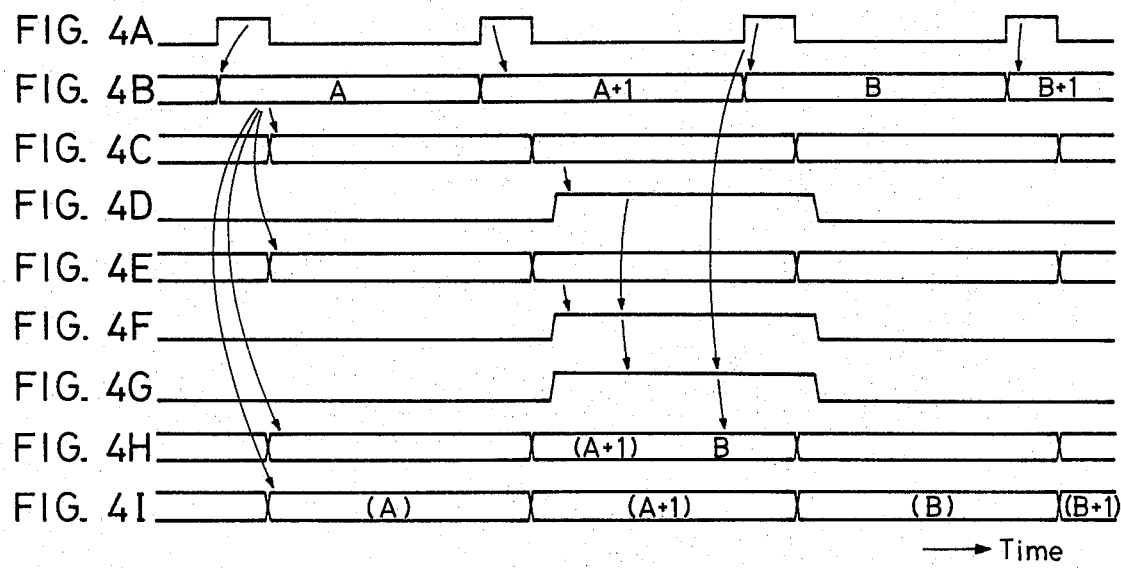

→ Time

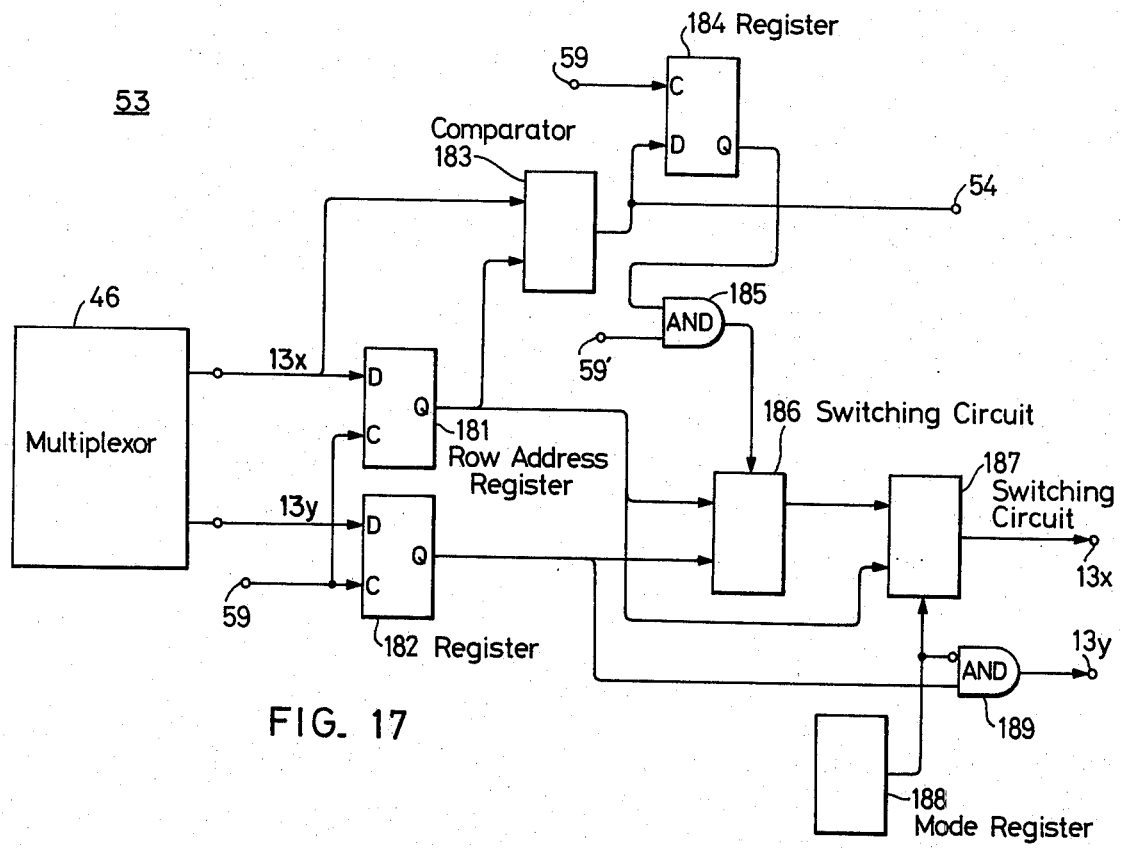
FIG. 17
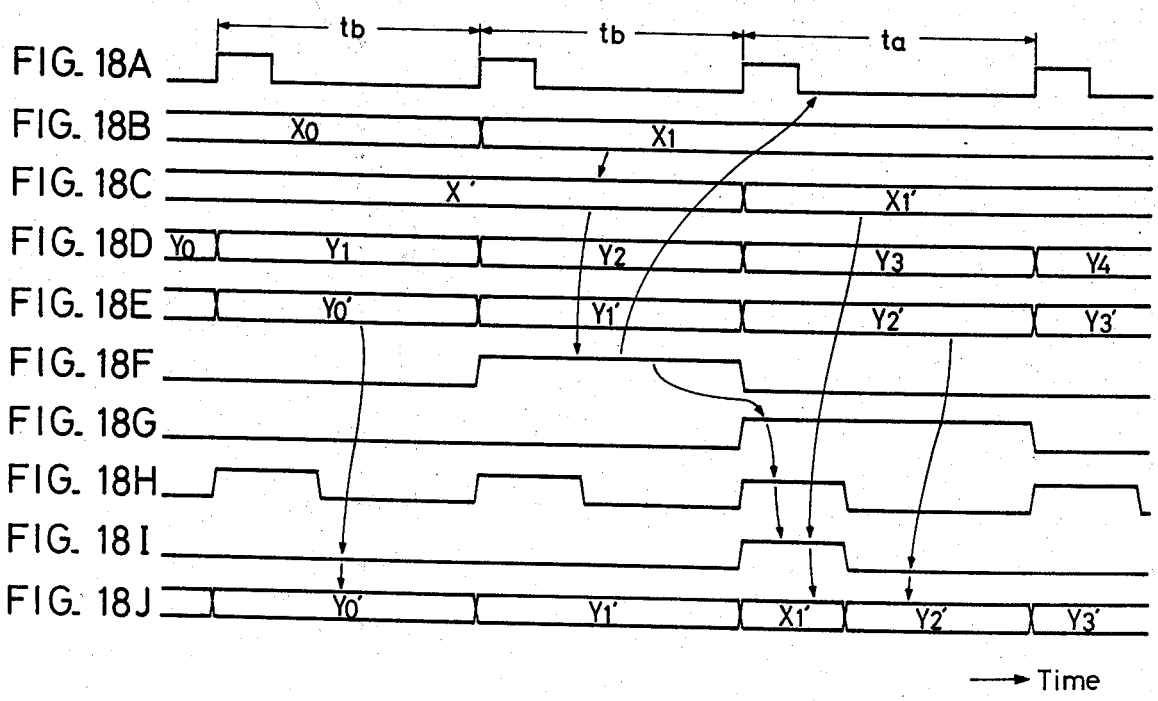

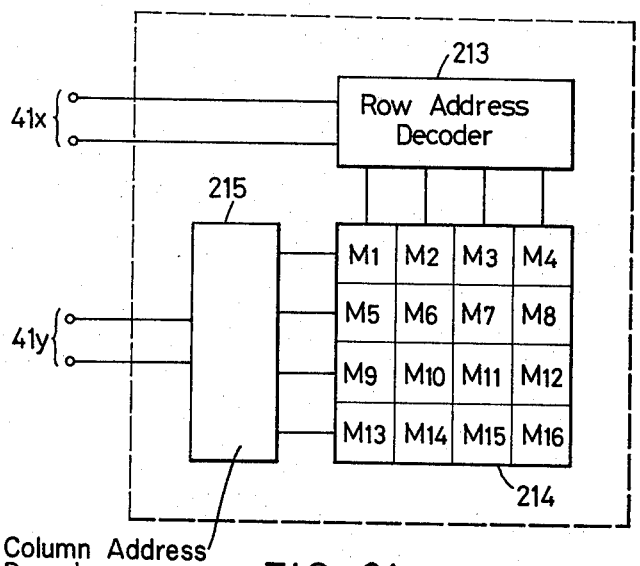
FIG. 21
| | Y | | X | |
|---|---|---|---|---|
| M1 | 0 | 0 | 0 | 0 |
| M2 | 0 | 0 | 0 | 1 |
| M3 | 0 | 0 | 1 | 0 |
| M4 | 0 | 0 | 1 | 1 |
| M5 | 0 | 1 | 0 | 0 |
| M6 | 0 | 1 | 0 | 1 |
| M7 | 0 | 1 | 1 | 0 |
| M8 | 0 | 1 | 1 | 1 |
| M9 | 1 | 0 | 0 | 0 |
| M10 | 1 | 0 | 0 | 1 |
| M11 | 1 | 0 | 1 | 0 |
| M12 | 1 | 0 | 1 | 1 |
| M13 | 1 | 1 | 0 | 0 |
| M14 | 1 | 1 | 0 | 1 |
| M15 | 1 | 1 | 1 | 0 |
| M16 | 1 | 1 | 1 | 1 |
| M17 | 0 | 0 | 0 | 0 |
FIG. 22
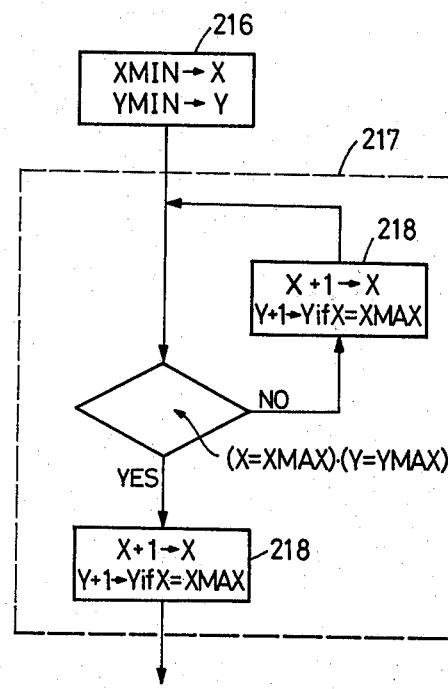
FIG. 23
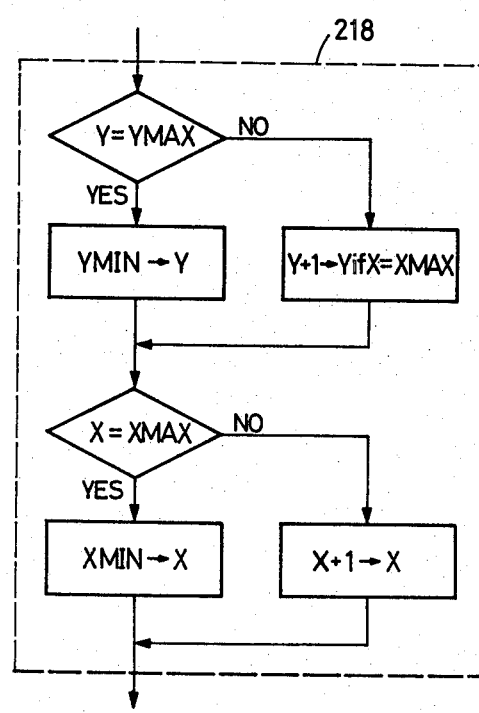
FIG. 24

TEST PATTERN GENERATING APPARATUS

BACKGROUND OF THE INVENTION

1. Field of the Invention

This invention relates to a test pattern generating apparatus which generates an address pattern and a data pattern for testing semiconductor memory systems.

2. Description of the Prior Art

To test a semiconductor memory, data is written in the semiconductor memory under test at a storage location specified by addressing and subsequently data at each storage location of the memory is read for comparison with an expected value to check whether or not the data read out is identical to the expected value, thereby checking whether the semiconductor memory functions properly or not. Such a test is accomplished by performing complicated operations, for example, repeatedly reading out the memory with data stored only at one address but no data at all the other addresses while shifting the single data storage location one by one for each memory readout. To perform this, it is customary to successively generate addresses as patterns together with various data corresponding thereto.

For such address pattern generation and data generation, a memory containing a microprogram is read to interpret and execute the program, thereby to generate an address pattern generate instruction, a data pattern generate instruction, a memory control instruction, etc. In accordance with these instructions, an address pattern generation section generates an address pattern by performing calculation pursuant to the address pattern generate instruction and a data pattern generation section generates a data pattern by performing an operation pursuant to the data pattern generate instruction. There has also been proposed a test system in which combinations of such address and data patterns are all prestored in a memory and read out therefrom for input into a memory under test. With such a storage memory system, the capacity of the memory for storing the test patterns inevitably becomes markedly large, especially in the case of testing a large capacity semiconductor memory. To avoid this, the abovesaid method of pattern generation by calculation is usually employed for testing a large capacity semiconductor memory. Such a semiconductor memory test apparatus is disclosed in U.S. Pat. No. 3,751,649 patented Aug. 7, 1973, entitled "Memory System Exerciser".

In the test pattern generator heretofore employed, the address pattern generation and the data pattern generation are performed entirely independently of each other and pattern generation sections are completely placed under program control; this imposes limitations on the pattern generation. It is effective to conduct a galloping, walking or like pattern memory test such that a special data pattern is generated in a memory area of the semiconductor memory under test, but there is a limit to complicated generation of a such a complicatedly changing address. The data pattern generation also has its limit. For example, it is effective, in itself, to test the semiconductor memory by inverting data and addressing a certain memory area of the semiconductor memory under test, but this needs a huge program for generating data patterns. Therefore, no heed has heretofore been taken of such a test which employs galloping, walking or like addressing and which inverts data stored at a specified memory area.

For a semiconductor memory in which each word is composed of a plurality of bits, it is effective to test the semiconductor memory by inverting or holding unchanged all data patterns to be written in the memory and, in the prior art, the inversion and non-inversion of the data patterns are accomplished under program control. But it is difficult to write data in the memory under test, inverting or holding them unchanged, and to test the influence of writing on addresses adjoining the accessed ones. In the prior art, since the inversion of the data to be written in the memory under test is conducted under program control, it is very important to invert only a specified one or more bits of one word of the data, thereby to test interference in the word and the influence on the adjoining words. In the past, however, such a test has not been conducted. The reason is that this test also has not been taken into account because a markedly complicated program is needed for the inversion control of a desired one or more bits of one word since all operations are achieved under program control.

For testing semiconductor memories, the galloping or walking test is effective, as described previously, and is convenient because it is regular and because the address pattern can be generated by calculation. In this test, however, even if a fault is found in the memory under test, it is difficult to precisely locate the fault. To solve this problem, there has heretofore been employed, as fault separation test patterns, special patterns with which it is possible to isolate the respective functions of a sense-amplifier, an address decoder, a memory cell, etc. formed in the memory. This test pattern cannot be generated by calculation because it lacks regularity in address generation. Accordingly, it is customary to prestore such special test patterns in a memory in the order of generation and to successively read them for input to a memory under test. To perform this, a test pattern generator for reading the patterns stored in the memory is prepared separately from the device for generating test patterns by calculation. In the case of testing a memory by supplying thereto the test patterns, switching over the two test pattern generators to each other, the so-called dummy cycle occurs at the time of switching, making it impossible to continuously test the memory in its cycle time. If such a dummy cycle exists, there is a fear that the internal state of the memory under test may be altered in the dummy cycle; so no accurate test can be accomplished. That is, an accurate memory test cannot be effected unless it is continuously performed at the operating speed of the memory under test. In the prior art, however, it is impossssible to accomplish such a memory test by continuously generating test patterns while switching over the operation type test pattern generator and the storage type test pattern generator between each other.

In this kind of test pattern generating apparatus, as the operating speed of the memory under test increases, it becomes more difficult to decide whether the test pattern being generated is proper or not. However, no accurate test can be accomplished unless an accurate test pattern is generated; therefore, it is important to decide if the test pattern is being generated properly. In the past, it has not been checked during test whether the patterns being generated are correct or not. Accordingly, it might be said that such a test pattern generating apparatus is low in reliability. It is important to check whether the test patterns are being generated correctly or not, and to this end, the so-called pattern trace test has heretofore been employed. This is to successively trace test patterns one by one so as to check whether the patterns being generated are correct or not; namely, the test patterns are generated in sequence to allow for checking. Accordingly, in this pattern trace test, the test patterns are not generated at the operating speed of the memory under test.

But it is also important to generate and check test patterns one by one. Such checking of all the test patterns is important but, in the prior art, pattern tracing is accomplished only in a portion of a test pattern suspected to include an error, thereby to check the pattern. To perform this, in the prior art, a test pattern generation program is executed by simulation until the pattern trace starting position is reached and then pattern trace is initiated. However, since the program proceeds by simulation, that is, by logic, a relatively long time is required until the pattern trace starting position is reached and consequently generated test patterns cannot be checked efficiently.

This kind of test pattern generating apparatus is designed so that prior to or during test, a variety of data are set, for instance, from an electronic computer for calculation based on the set data. Unless the data thus set in the test pattern generating apparatus is correct, correct test patterns cannot be generated. A method that has been employed in the past for checking the data is to write the data in a register in a transfer cycle and to read the data in the next cycle for checking whether they are correct or not. Accordingly, two device cycles are required for transferring one set of data, so that in the data transfer cycle during which the test pattern generating apparatus is in operation it is impossible to check whether the data is transferred correctly or not. Further, for checking the transferred data, a read cycle is required, for which transfer operation takes much time.

The memory under test is sometimes accessed, for example, with a row address being fixed but a column address being successively changed, and in addition, in some types of memories, the row and column addresses are received by common terminals, and the addresses being supplied alternately with each other are distributed as row and column addresses. A system for testing such memories, with the row address being fixed and the column address being changed, is referred to as a page mode test. For automatic execution of such a page mode test, it is necessary for a programmer to make a page mode test program, bearing in mind that the row address is retained unchanged, which imposes a great burden on him. Especially in the case of changing at least one of the addresses at random, it is almost impossible to make a program so one of the addresses is fixed and that the other is varied. Therefore, the page mode test cannot be made in such a case where one of the addresses is fixed.

The generation of the row and column addresses by calculation, has been achieved under program control in the past to successively generate, for example, row addresses and to detect them when they have reached a boundary value and then to generate a column address by calculation. In this case, the program becomes longer in that the storage capacity for storing the program increases and the program requires much time for pattern generation.

SUMMARY OF THE INVENTION

An object of this invention is to provide a test pattern generating apparatus which is capable of inverting a data pattern to be supplied to a desired area of a memory under test, without using a complicated program, thereby to ensure an accurate test of the memory.

Another object of this invention is to provide a test pattern generating apparatus which is capable of inverting one or more designated bits of one-word data while freely designating the bits to be inverted and which does not require a complex program therefor.

Another object of this invention is to provide a test pattern generating apparatus in which pattern generation by the system itself and pattern generation by successively reading out stored patterns may be selectively alternated, by which test patterns can be generated with no dummy cycle generation.

Another object of this invention is to provide a test pattern generating apparatus in which, during the testing of a memory, test patterns being generated at high speed can easily be checked as to whether they are correct or not.

Another object of this invention is to provide a test pattern generating apparatus in which a large number of continuous test patterns can be generated rapidly at a desired position, and thereafter, for example, a pattern trace can be performed.

Another object of this invention is to provide a test pattern generating apparatus in which in a transfer cycle of data being transferred from an external input to a register, the data can be checked whether it is correctly transferred to the register or not, so that the transfer speed can be increased, and in which, even during operation, transfer information can be checked to ensure correct test pattern generation.

Another object of this invention is to provide a test pattern generating apparatus which enables a page mode test to be automatically achieved by the hardware structure without program control, thereby to shorten the program used.

Still another object of this invention is to provide a test pattern generating apparatus which has such a hardware construction that when the calculated row address has reached a boundary value, an operation for column address generation is immediately initiated, whereby to shorten the program used and generate address patterns at high speed.

As is the case with the type of apparatus heretofore employed, there is loaded in an instruction memory of a program control section a microprogram having described therein test patterns to be generated. The instruction memory is read to interpret and execute the program, thereby to output an address pattern generate instruction, a data pattern generate instruction, a memory control instruction and a status information select instruction. The address pattern generate instruction is supplied to an address generation section, which follows the instruction to perform a calculation for generating an address pattern. The data pattern generate instruction is entered in a data pattern generation section, which performs a calculation following the instruction to generate a data pattern. The memory control instruction is applied to a memory control generation section to generate therefrom memory control signals, such as a write signal, a read signal, a chip select signal, etc. The status information select instruction and a plurality of data including at least part of the address pattern from the address pattern generation section are provided to a status information generation section, in which the two input data are compared and from which the comparison result is provided as status information to the program control section in accordance with the abovesaid status information instruction. Based on the status information, the program control section modifies the sequence of execution of the microprogram.

With the present invention, in the data pattern generation section, the address pattern yielded from the address pattern generation section is provided to an area inversion control signal generation unit to derive therefrom an inversion control signal indicating whether data is to be inverted or not. The data pattern, calculated in an arithmetic unit in accordance with the data pattern generate instruction, is inverted by the inversion control signal in an inverter and provided as an output data pattern. The above-mentioned area inversion control signal generation unit has an inversion area addressing memory, which is read, using an input address pattern as an address, and on the basis of the read output, the inversion control signal is produced. It is also possible that the read output itself is used as the inversion control signal. Alternatively, two inversion area addressing memories are provided respectively for row and column addresses and read outputs from both memories are provided to a logic circuit to obtain the inversion control signal. Various kinds of such logic circuits are prepared and one of them is selected for each modification of the inverted area specified. The inversion area specifying memory may also be so constructed as to read therefrom either one of the row and column addresses. By modifying the content of the inversion area specifying memory or by selecting the logic function of the logic circuits, various inversion areas can be addressed.

The inversion control signal may also be generated in the following manner: data addressing an inversion area is placed in an inversion area specifying register and compared with an address from the address pattern generation section in a comparator to provide an inversion control signal based on the result of comparison. Further, such inversion control signal can also be generated by providing a plurality of sets of inversion area specifying registers and comparators corresponding thereto and forming logic functions of the outputs from the comparators with logic circuits. Also it is possible to produce the inversion control signal in the following manner: different row addresses are stored as inversion area addresses in a plurality of row inversion area addressing registers; a plurality of column inversion area addresses are similarly stored in a plurality of column inversion area addressing registers; row addresses in an address pattern from the address pattern generation section and the contents of the plurality of row inversion area addressing registers are respectively compared by a plurality of comparators; column addresses in the address pattern and the contents of the plurality of column inversion area addressing registers are respectively compared by a plurality of comparators: and the compared outputs from the pluralities of comparators are each inputted to a logic circuit to yield an inversion control signal. Also in this case, a plurality of logic circuits are provided and one of them is selected by a selector to enable various kinds of inversion area addressing. Namely, by selecting the addresses placed in the inversion area addressing registers and the logic functions, addressing of the inversion area in the memory under test can easily be changed at will.

In an inversion bit specifying register is stored data which specifies those bits of the abovesaid data pattern which are to be inverted and, in accordance with the contents of respective bits stored in the inversion bit specifying register, the corresponding bits of the data patterns calculated in the arithmetic unit are inverted in an inverter. In this instance, a gate is provided, through which the content of the inversion bit specifying register is supplied as an inversion control signal to the inverter in response to an inversion instruction included in the data pattern generate instruction.

A plurality of sets of an address pattern, a data pattern and a memory control signal may be stored in a buffer memory section, and when a buffer memory select instruction from the aforementioned program control section is supplied to the buffer memory section, the reading of the buffer memory section is started by the same operating clock as the operating clock of the address pattern generation section and the data pattern generation section. During readout of the buffer memory section, a buffer memory operation signal is yielded, by which an address select circuit is controlled to output the address pattern read from the buffer memory section in place of the address pattern from the address pattern generation section, a data select circuit is controlled to output the data pattern read from the buffer memory section in place of the data pattern from the data pattern generation section and a memory control signal select circuit is similarly controlled to output the memory control signal read from the buffer memory section in place of the memory control signal from the memory control signal generation section. Further, by the buffer memory operation signal, the operations of the address pattern generation section, the data pattern generation section and the program control section are stopped. This suspension of operation may also be accomplished by providing the buffer memory operation signal to the program control section to stop therethrough the operations of the pattern generation sections. In the buffer memory section, there is stored in an area storage portion at least one piece of information indicating the memory area to be continuously read out, and in response to the information from the area storage portion, readout of a buffer memory in the buffer memory section is carried out. This area assignment is achieved using addresses of the first and last ones of the area to be read successively or the first address and the number of patterns between the first and last addresses. Moreover, a plurality of units of information indicating the areas to be successively read from the buffer memory section may be stored in the area storage portion and one of these area information units may be selected by an area select signal from the program control section. In this manner, the generation of irregular address patterns and the corresponding data patterns from the buffer memory section and the generation of address patterns and data patterns by calculation can be switched over to each other without generating any dummy cycle.

There are provided an address pattern detector for detecting a specified one of the generated address patterns and a data pattern detector for detecting a specified one of the generated data patterns. One of the outputs from the detectors and the output from the memory control signal generation section is selected by a select circuit and the frequency of generation of the selected output is counted by a counter. Since the frequency of generation of the above-said specified address and data patterns is constant for each test pattern to be generated if the test pattern is being generated correctly, it is possible to presume from the count value of the counter whether the correct test pattern is generated or not. In this instance, it is also possible not only to count the output from each of the corresponding address and data pattern detectors but also to count the number of outputs simultaneously generated from a plurality of such detectors. Thus, while a memory is under test, that is, during generation of test patterns at a relatively high speed or in a normal operating state of the memory under test, it is possible to presume whether the test pattern generation is performed correctly or not. On top of that, when the test pattern generation is the faulty, the location of fault can also be presumed.

When the address pattern from the address pattern generation section becomes the specified pattern, it is detected by a first address detector and when the address of an instruction memory of the program control generation section being executed reaches a predetermined address, it is detected by a second address detector. Upon detection of coincidence by at least one of the outputs from the first and second address detectors, the operation of the entire system is stopped. In this manner, until a predetermined address pattern or a predetermined address of the instruction memory is provided, the test pattern generating apparatus is operated at high speed and its operation is stopped when the specified address is reached, whereby to advance the program by one step, achieving the so-called pattern trace. Further, in the case of starting the test of the memory with the specified test pattern, the operation of the test pattern generating apparatus can proceed to the position of the specified pattern at high speed. It is also possible that when the outputs from the first and second address detectors coincide with each other, the operation of the test pattern generating apparatus is stopped to initiate the next operation.

The program control section, the address pattern generation section and the data pattern generation section are respectively connected via a bus with an external control unit, for example, an electronic computer, and a separator is inserted in the bus. In the data transfer from the external control unit to the program control section, the address pattern generation section and the data pattern generation section, after the data is transferred via the separator to a desired register, an instruction is provided to read the transferred data from the register in the data transfer cycle and, at this time, the separator cuts off the bus as to transmission in both directions. In this separated state, data to be transferred which is provided from the external control unit and the data read from the register are compared in a comparator. The comparator output is read in this separated state and loaded into the external control unit, thereby to decide whether the data is transferred correctly or not. In this manner, it is decided whether the data transfer is accomplished correctly or not in the transfer cycle, so that high-speed transfer is possible and a read cycle need not be provided.

A row address in a current address pattern being generated from the address pattern generation section and a row address generated in the immediately preceding period are compared by a comparator and when the result of comparison is non-coincidence, the current row address and the column address in the current address pattern are outputted alternately. When the row addresses are detected by the comparator to be coincident with each other, only the current column address is outputted. Where the non-coincidence is detected by the comparator, the operating period of the apparatus is switched over to enable transfer of the row and column addresses. If the row address is not modified, only the column address is sent out and the so-called page mode test pattern is automatically generated to accomplish a page mode test. Accordingly, in the making of a program for the test pattern generation, a programmer is not required to write the program include the page mode test routine, so that programming is easy and, even in the case of complicated address modification, the page mode test can be achieved. Such a page mode test is applied to a memory whose external terminals are common to the row and column addresses and, in the case of a memory in which row and column address input terminals are provided separately, the row and column addresses are simultaneously applied. Therefore, switching means is provided by which simultaneous application of the row and column addresses in the address pattern from the address pattern generation section and individual application of the row and column addresses in the same period are switched between each other in accordance with the memory under test.

In the address pattern generation section, row and column address operation units respectively generate row and column address patterns by calculation in response to row and column address generate instructions from the program control section. A predetermined address indicating, for example, a boundary value is loaded in an address register and this address is compared by a comparator with the row address from the row address calculation unit. Only when both addresses are coincident with each other does the calculation of the column address operation unit advance by a one step to generate one column address pattern and then the calculation unit for the row address operation is put into operation again. Thus, the row address generation and the column address generation are associated with each other not under program control but by hardware, by which the generation of the address pattern is accomplished at high speed and the program length can be reduced.

BRIEF DESCRIPTION OF THE DRAWINGS

FIG. 3 is a block diagram illustrating, by way of example, a program control section 24 and a status information generation section 25;

FIGS. 4A-4I set forth a time chart explanatory of the operation of the control section 24 depicted in FIG. 4;

FIG. 17 is a block diagram showing an example of a page mode control section 53 in FIG. 2;

FIGS. 18A–18J set forth a time chart explanatory of the operation of the page mode control section of FIG. 17;

FIG. 21 is a block diagram showing an example of the inside of the memory under test.

FIG. 22 is a diagram showing the relationship between each memory cell of the memory in FIG. 2 and an address;

FIG. 23 is a flow chart illustrating an example of the operation of the address pattern generation section;

FIG. 24 is a flow chart showing an example of the operation sequence of a sequence 218 in FIG. 23.

DESCRIPTION OF THE PREFERRED EMBODIMENTS

Figure 1:
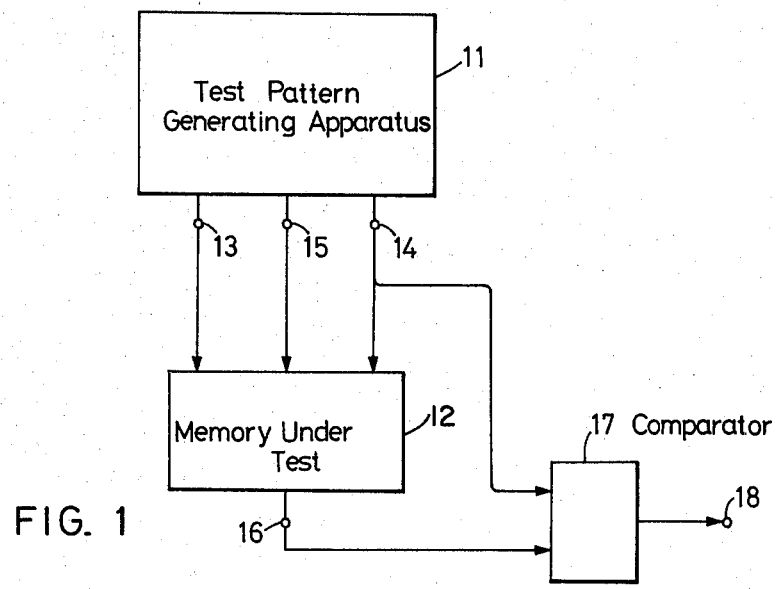
FIG. 1 is a block diagram illustrating a memory test using a test pattern generating apparatus.

The test pattern generating apparatus of this invention is employed for testing a semiconductor memory, for example, as shown in FIG. 1. That is, the test pattern generating apparatus of this invention, indicated by 11, provides at a terminal 13 an address pattern specifying an address of a memory under test 12 and at a terminal 14 data to be written in the address accessed by the address and, as a consequence, the data is written in the memory under test 12. When the memory under test 12 is read at the address specified by the address generated at the terminal 13, an expected data value is provided at the terminal 14 for checking whether the data read out is correct or not. Read/write control for the memory under test 12 is accomplished by a memory control signal provided at a terminal 15. The data read out from a terminal 16 of the memory under test 12 and the expected value pattern from the terminal 14 of the test pattern generating apparatus 11 are compared in a comparator 17 and, in the case of non-coincidence, there is generated from a terminal 18 a signal indicating that the memory under test 12 is faulty.

Figure 2:
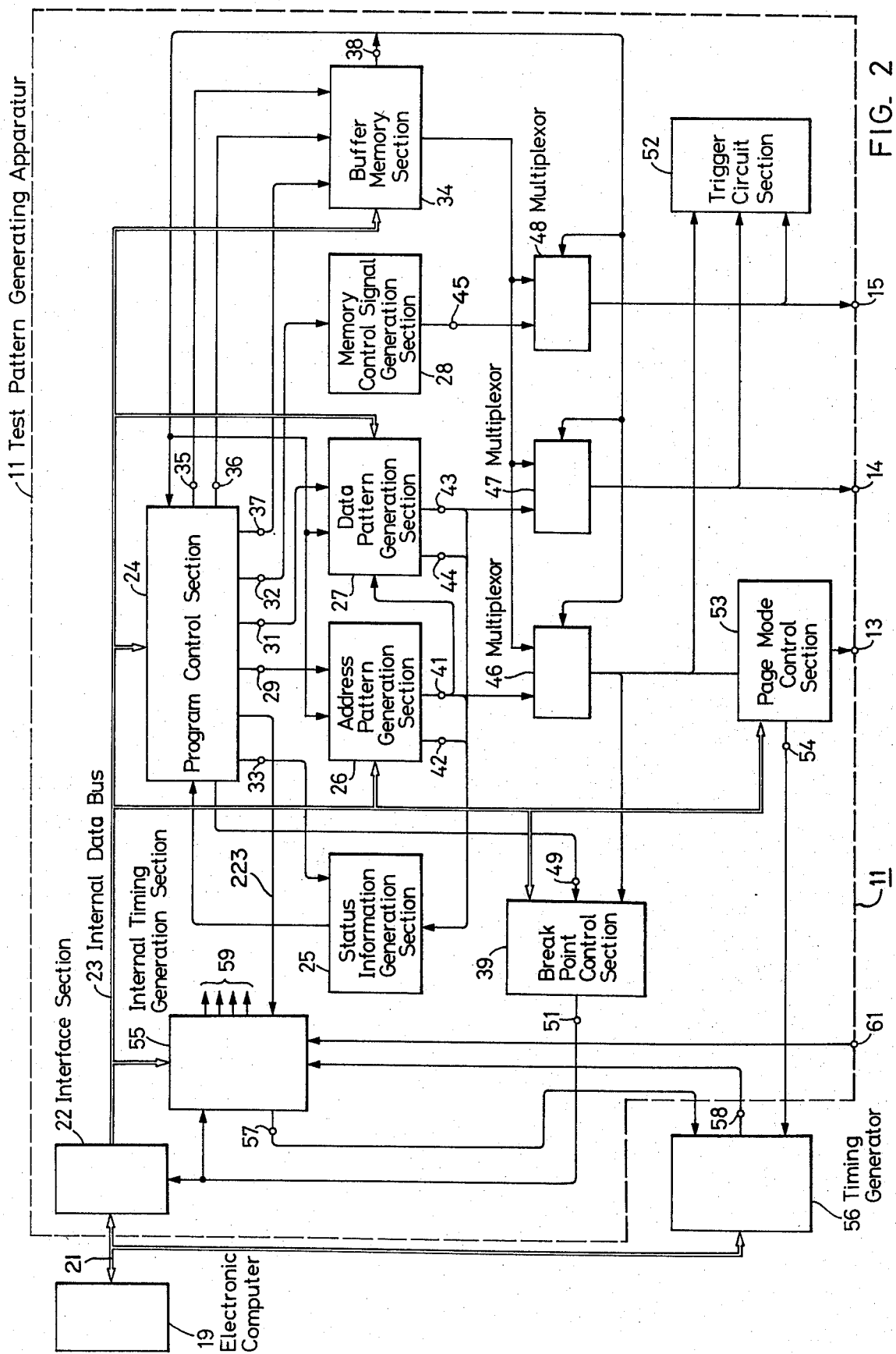
FIG. 2 is a block diagram showing an embodiment of a test pattern generating apparatus of this invention.

The test pattern generating apparatus 11 successively generates, under the control of a program stored therein, sets of address patterns, data patterns and memory control signals to test the memory 12. The test pattern generating apparatus 11 has such a construction as outlined in FIG. 2. Data necessary for the operation of the test pattern generating apparatus 11 are provided from an external control device, for example, an electronic computer 19. The electronic computer 19 has a function of providing a pattern generation program for the test pattern generating apparatus 11 and, as required, transfers via a data bus 21 to the test pattern generating apparatus 11 the pattern generation program and data for internal registers necessary for the pattern generation and reads the content of the internal registers.

The data transferred from the electronic computer 19 via the data bus 21 is provided via an interface section 22 to an internal bus 23 of the test pattern generating apparatus 11, from which the data are sent to registers and memories in the test pattern generating apparatus 11. When supplied with a signal from the electronic computer 19 to read an internal register or a memory of the test pattern generating apparatus 11, the interface section 22 transfers to the electronic computer 19 the content of the register or memory specified via the internal bus 23. Further, in the present invention, when the data is transferred to the test pattern generating apparatus 11, the interface section 22 reads the data transferred to the internal register or memory to check whether the data was transferred correctly or not in the transfer cycle.

A program control section 24 in the test pattern generating apparatus 11 applies pattern generate instructions to an address pattern generation section 26, a data pattern generation section 27 and a memory control signal generation section 28 from terminals 29, 31 and 32, respectively, in accordance with a pattern generating program transferred via the internal bus 23, and receives status information from a status information generation section 25. Further, the program control section 24 provides from its terminal 33 a status information select instruction to the status information generation section 25. Moreover, when a buffer memory operate instruction is decoded from the program, the program control section 24 provides from its terminal 35 a buffer memory control signal to a buffer memory section 34. At this time, the program control section 24 transfers from its terminals 36 and 37 to the buffer memory section 34 a program control signal and an area select signal indicating the memory area to be read, respectively. While the buffer memory section 34 is in operation, the program control section 24 is supplied with a buffer memory operation signal from a terminal 38 to stop its operation. Further, the program control section 24 transfers to a break point control section 39 an address of an instruction memory loaded with the pattern generation program.

In response to the address pattern generate instruction supplied from the terminal 29 of the program control section 24, the address pattern generation section 26 generates an address pattern to be applied to the memory under test and provides it at a terminal 41 and stops the pattern generating operation on receipt of the buffer memory operation signal on terminal 38. The address pattern thus derived at the terminal 41 and the content of an internal register of the address pattern generation section 26 provided at a terminal 42 are both transferred as program control data to the status information generation section 25.

The data pattern generation section 27 responds to the pattern generate instruction applied thereto from the terminal 31 of the program control section 24 to generate by calculation a data pattern to be provided to the memory under test and an expected value pattern and provides them at a terminal 43. The data pattern generation section 27 stops its operation or receipt of the buffer memory operation signal from the terminal 38. The data pattern provided at the terminal 43 and the content of an internal register of the data pattern generation section 27 provided at a terminal 44 are both transferred as program control data to the status information generation section. The data pattern generation section 27 has the capability by which the generated data pattern may be inverted in accordance with the address pattern being derived at the terminal 41.

The memory control signal generation section 28 responds to the pattern generate instruction applied thereto from the terminal 32 of the program control section 24 to generate at a terminal 45 a memory control signal to be applied to the memory under test, such as a READ/WRITE signal. The status information generation section 25 is supplied with the address pattern from the address pattern generation section 26 and the data loaded in its internal register necessary for the pattern generation, and the data pattern from the data pattern generation section 27 and the data loaded in its internal register necessary for the pattern generation. The status information generation section 25 makes a comparison between these two data, or between one of them and predetermined data, and when supplied with the status information select instruction from the terminal 33 provides the comparison result as status information to the program control section 24.

The buffer memory section 34, when supplied with the buffer memory control signal and the program control signal from the terminals 35 and 36 of the program control section, reads out those of the address patterns, the data patterns and the memory control patterns prestored in an internal memory via the internal bus 23 which lie in the range selected by the area select signal from the terminal 37 of the program control section 24. The patterns thus read out are applied to multiplexors 46, 47 and 48. While the patterns are provided from the buffer memory section 34, the buffer memory operation signal is output at the terminal 38.

The multiplexors 46, 47 and 48 are controlled by the buffer memory operation signal from the terminal 38 and respectively output the patterns applied thereto from the address pattern generation section 26, the data pattern generation section 27 and the memory control signal generation section 28, or the address pattern, the data pattern or the memory control pattern from the buffer memory section, in dependence upon whether the buffer memory operation signal is "0" or "1".

The breakpoint control section 39 is supplied with the address of the instruction memory of the program control section 24 via a terminal 49 and the address to be applied to the memory under test from the address multiplexor 46. Specified addresses are prestored in two internal registers of the breakpoint control section 39 via the internal bus 23, and the contents of the registers are respectively compared with the address at the terminal 49 and the output from the multiplexor 46; when at least one of the contents of the registers coincide, a coincidence signal is provided at a terminal 51.

The address pattern, the data pattern and the memory control signal from the multiplexers 46, 47 and 48 are also inputted to a trigger circuit section 52, in which they are compared with data designated as by switches to count the frequencies of occurrence of the patterns and the memory control signal from section 28.

The address pattern from the address multiplexor 46 is applied to a page mode control section 53. The page mode control section 53 has a function by which when a page mode test is selected under program control, row and column addresses of the inputted address pattern are outputted alternately in pairs in each period. Where the row address of the immediately preceding period and the row address being currently outputted coincide with each other, the alternating switching between row and column addresses is inhibited and only the column address is outputted. When the abovesaid row addresses coincide with each other, the page mode control section 53 provides at its terminal 54 a signal for selecting the operating periods of the pattern generating apparatus.

An internal timing generation section 55 is to generate operating clocks for the respective sections of the test pattern generating apparatus 11. The operating clocks are produced on the basis of a clock supplied from a timing generator 56. When supplied with an operation start instruction of the test pattern generating apparatus 11 via the internal bus 23 from the electronic computer 19, the internal timing generation section 55 applies from its terminal 57 an operation signal to the timing generator 56.

To the timing generator 56 is previously transferred via the bus 21 from the electronic computer 19 a combination of several kinds of information indicating the periods and the widths and phases of clocks to be generated. When the operation signal from the internal timing generation section 55 is "1", the timing generator provides at its terminal 58 a clock having the period, width and phase selected by a select signal at a terminal 54.

In the arrangement of the test pattern generating apparatus 11 described above, the interface section 22, the program control section 24, the status information generation section 25, the address pattern generation section 26, the data pattern generation section 27, the memory control signal generation section 28 and the internal timing generation section 55 are also employed in conventional devices of this kind. In this invention, however, the address pattern generation section 26 and the data pattern generation section 27 have functions which have not been given in the prior art. The buffer memory section 34, the breakpoint control section 39, the multiplexors 46, 47 and 48, the trigger circuit section 52 and the page mode control section 53 are also provided according to this invention.

Prior to the operation of the test pattern generating apparatus 11, data indicating the ranges of address patterns which differ with the capacities of memories under test and a pattern generating program described by a microprogram are respectively transferred to the pattern generation sections 26 and 27 and the instruction memory of the program control section 24 via the interface section 22 and the internal bus 23 from the external control unit, that is, the electronic computer 19. In this instance, upon transfer of each word of data, the interface section 22 reads the transferred data and checks whether or not it is coincident with the data to be transferred, and in the case of non-coincidence, it is regarded as indicating a failure and a transfer reject signal is sent to the electronic computer 19.

An actual pattern generation is initiated by transferring an operation start instruction from the electronic computer 19 to the internal timing generation section 55 upon completion of the abovesaid data transfer. When supplied with the operation start instruction, the internal timing generation section 55 provides an operation signal to the timing generator 56, by which the timing generator 56, in turn, applies a clock to the internal timing generation section 55. The timing generation section 55 generates from the clock at its terminals 59 various kinds of clocks defining the operation timings in the test pattern generating apparatus 11 and applies them to the respective sections.

Upon application of the operation clock to the program control section 24, the program described by a microprogram, which was transferred to the instruction memory in the previous data transfer, is successively interpretted and provided as pattern generate instructions to the address and data pattern generation sections 26 and 27. To the memory control signal generation section 28 are directly applied bits of the memory control signal provided at the terminal 32. When an instruction modifying the sequence of reading the instruction memory is interpreted from the microprogram in the program control section 24, the address of the instruction memory to be read is jumped, i.e. the sequence of addresses for reading is modified in response to status information from the status information generation section 25 which is determined by the contents of the registers of the address and data pattern generation sections 26 and 27.

In the address pattern generation section 26, based on the pattern generate instruction applied thereto from the terminal 29 and the data of the internal register transferred thereto by the aforesaid data transfer, an operation is accomplished in synchronism with the operation clock from the terminal 59 to produce an address pattern.

In response to the data pattern generate instruction from the terminal 31 and the data loaded in the internal register in the aforesaid data transfer, the data pattern generation section 27 performs an operation in synchronism with the operation clock from the terminal 59 to provide a data pattern. Where an inversion instruction is added to the pattern generate instruction at the terminal 31, a specified bit or bits of the data generated by the above operation are inverted in accordance with the content of the data placed in the internal register in the abovesaid data transfer. Where an area inversion mode register in the data pattern generation section 27 is set up by the data transfer, the data generated by the above operation is inverted at a specified address or addresses in the address pattern yielded from the address pattern generation section 26.

The memory control signal generation section 28 receives the memory control signal from the terminal 32 of the program control section 24 in synchronism with the operation clock from the terminal 59. The address pattern, the data pattern and the memory control signal thus obtained are applied to the memory under test via terminals 13, 14 and 15 of the test pattern generating apparatus 11 when the operations of the buffer memory section 34 and the page mode control section 53 are inhibited.

During testing the memory under test by applying thereto the address and data patterns and the memory control signal as mentioned above, if a fault is detected, that is, if a noncoincidence signal is derived from the comparator 17 in FIG. 1, the fault signal is applied from a terminal 61 to the internal timing generation section 55. Then, the internal timing generation section 55 clears the operation signal at the terminal 57, by which the transfer of the clock from the timing generator 56 is stopped and, at the same time, the operation clocks are stopped. Simultaneously with stopping of the operation of the test pattern generating apparatus 11, the detection of the fault is displayed. Further, when the program control section 24 interprets a test pattern generating an apparatus stop instruction, a stop signal is provided to the internal timing generation section 55, by which the operation signal at the terminal 57 is cleared and, as a result, the test pattern generating apparatus 11 similarly comes to a standstill.

As the address pattern generation section 26 and the data pattern generation section 27 generate patterns by calculation, there is a limit to their pattern generation. For generating a pattern that would normally be unobtainable by calculation, for example, a pattern which varies entirely at random or accesses the neighborhood of a specified address at random, the buffer memory section 34 is employed. In the case of using the buffer memory section 34, before starting the pattern generating operation, address, data and memory control patterns to be outputted from the buffer memory section 34 are loaded the memory of the buffer memory section 34 via the internal bus 23 from the electronic computer 19 and several kinds of data indicating the ranges of the memory to be read are also loaded in registers of the buffer memory section 34 via the internal bus 23 from the electronic computer 19.

To the buffer memory section 34 is supplied the buffer memory control signal interpreted in the program control section 24 from the terminal 35. When a predetermined condition is satisfied, that is when the status information is obtained from the status information generation section 25, the program control signal occurs at the terminal 36 of the program control section 24. The program control signal and the buffer memory control signal are applied to the buffer memory section 34, by which the address patterns in the range of the buffer memory indicated by a register specified by the area select signal from the terminal 37 of the program control section 24 are read by the same operation clocks as that of the pattern generation sections 26 and 27 and provided to the multiplexors 46 to 48. By the buffer memory operation signal derived at the terminal 38 during the operation of the buffer memory section 34, the operations of the program control section 24, and the address and data pattern generation sections 26 and 27, are stopped, and the data read from the buffer memory section 34 are provided via the multiplexors 46 through 48 to the memory under test. Upon completion of reading data from the selected area of the buffer memory of the buffer memory section 34, the buffer memory operation signal at the terminal 38 is cleared. At the same time, the program control section 24 and the address and data pattern generation sections 26 and 27 start their operation to apply therefrom data to the memory under test via the multiplexors 46 to 48, respectively. Since the pattern generation by calculation in the program control section 24 and is the pattern generation sections 25 and 26, the pattern generation by reading the stored patterns in the buffer memory section, are both performed with the same operation clocks, both these pattern generations are switched over to each other without generating any dummy cycle to ensure continuous pattern generation.

Where external address terminals of the memory under test are common to row and column addresses, the memory is tested in the page mode in which the row address is fixed and only the column address is changed. This page mode test is made possible by transferring from the electronic computer 19 data indicating the page mode test to the page mode control section 53 in which the data is stored in a register holding the page mode test. As a consequence, the page mode control section 53 starts its operation.

Upon setting the page mode, the page mode control section 53 outputs row and column addresses in one address pattern normally available from the multiplexor 46 while switching back and forth between them in each period of the timing of the operation clock. Where the row address from the multiplexor 46 is equal to the row address of the immediately preceding period, the page mode control section 53 inhibits the switching of the row and column addresses, providing only the column addresses to the memory under test. At the same time, a signal for selecting the operating period is applied from the terminal 54 to the timing generator 56 in the period immediately before the column address is outputted.

The timing generator 56 supplies the internal timing generation section 55 with a clock signal having the period selected by the timing select signal from the terminal 54.

During the operation of the test pattern generating apparatus 11, the trigger circuit 52 selects one or more of the memory control signals, as described previously, which are coincident with the output address and data from the multiplexors 46 and 47, and counts the number of each of them with a counter. At the start of the operation of the test pattern generating apparatus 11, the content of the counter is cleared for counting the number of the signal which is selected during the operation of the test pattern generating apparatus 11. If the count value is coincident with a value determined by the pattern to be generated, it can be presumed that the pattern generated is correct.

The breakpoint control section 39 stops the operation of the test pattern generating apparatus 11 at a desired address of the instruction memory of the program control section 24 and at a desired address which is applied to the memory under test. The addresses of the instruction memory and of the memory under test at which the stop is to occur are transferred to registers of the breakpoint control section 29 prior to the operation of the test pattern generating apparatus 11. At the moment of coincidence between the address of the instruction memory and the supplied instruction memory address and between the address of the memory under test and the supplied address of the memory under test, the breakpoint control sectin 24 sends a coincidence signal from its terminal 51 to the internal timing generation section 55 and to the electronic computer 19 via the interface section 22. Upon receiving the coincidence signal, the internal timing generation section 55 clears the operation signal at the terminal 57 to stop its operation. In the electronic computer 19, after receiving the coincidence signal, it is possible to check the data loaded in the registers in the test pattern generating apparatus 11 under program control. Further, pattern trace can be accomplished.

Next, a detailed description will be given of the constructions and the operations of the respective sections. FIG. 3 illustrates in block form the program control section 24. Before starting the pattern generation, a program described by a microprogram transferred via the internal bus 23 is loaded in an instruction memory 62 at an address specified by an instruction memory address 63. During operation, the memory 62 is accessed with the address 63 to provide a status information select signal at a terminal 33, a jump address of the instruction memory at a terminal 64, a control instruction at a terminal 65, an address generate instruction at a terminal 66, a data generate instruction at a terminal 67, a memory control signal at a terminal 32 and an area select signal to a buffer memory at a terminal 37.

In dependence upon whether a mode select signal at its terminal 69 is "0" or "1" a program counter 68 provides, as the instruction memory address 63, an address following the address already in the program counter or a jump address from a multiplexor 71 at the timing of a clock applied to a terminal 72. While the buffer memory operation signal at the terminal 38 is "1", an AND circuit 73 is closed to inhibit the operation clock from the terminal 59 of the internal timing generatin section 55; and while the buffer memory operation signal is "0", the AND circuit 73 is opened to pass on the operation clock to the program counter 68 via an OR circuit 74. When a data transfer signal in the internal bus 23, which is applied to a control terminal 75 of the multiplexor 71 prior to the operation of the test pattern generating apparatus 11, is "1", data of the instruction memory address on the internal bus 23 is provided via the multiplexor 71 to the program counter 68. When the abovesaid data transfer signal is "0", a jump address from the terminal 64 is applied via the multiplexor 71 to the program counter 68.

In the status information generation section 25, a multiplexor 76 is controlled by a status information select instruction from the instruction memory 62 via its terminal 33 to select two of the data applied to the section 25 from the address pattern generation section 26 via the terminals 41 and 42 and from the data pattern generation section 27 via the terminals 43 and 44. The two data selected by the multiplexor 76 are compared in a comparator 77 under the condition given by the status information select instruction and the result of comparison is outputted as status information. This status information is supplied to an AND circuit 78 and, at the same time, outputted as a program control signal at the terminal 36.

The control instruction provided at the terminal 65 is decoded by a decoder 79 and applied as a jump instruction to the AND circuit 78 or as a buffer memory operate instruction to the terminal 35. The address generate instruction at the terminal 66 is decoded by a decoder 81 to provide an address pattern generate instruction at the terminal 29. The data generate instruction from the terminal 67 is decoded by a decoder 82 to yield a data pattern generate instruction at the terminal 31.

The program transfer to the instruction memory 62 is achieved by transferring thereto data from the internal bus 23 while addressing by the program counter 68. The address transfer to the program counter 68 in this case is accomplished by making both of terminals 69 and 75 "1", applying an address from the internal bus 23 to the program counter 68 via the multiplexor 71 and "1" from the internal bus 23 to a terminal 72 via the OR circuit 74. At this time, "1" is provided from the internal bus 23 to a terminal 69 via an OR circuit 84. An address of the instruction memory 62 from which the program control section 24 starts its operation is similarly set in the program counter 68 before the start of the operation.

Upon occurrence of the operation clock at the terminal 59 after transferring the program to the instruction memory 62 and the start address to the program counter 68, the operation of the program control section 24 is initiated.

Turning next to FIGS. 4A to 4I, the operation of the program control section 24 will be described.

When the operation clock is provided at the terminal 59, the program counter 68 increments in synchronism with the clock (FIG. 4A) at the terminal 72 to change the address to A, A+1, as shown in FIG. 4B, while the mode select signal (FIG. 4G) at the terminal 69 is "0". The instruction memory 62 is accessed with the instruction memory address 63 to provide a status information select instruction (FIG. 4E) at the terminal 33, a jump address (FIG. 4H) of the instruction memory 62 at the terminal 64, a control instruction (FIG. 4C) at the terminal 65, a data generate instruction at the terminal 67, a memory control signal at the terminal 32 and an area select signal at the terminal 37. The control signal through the area select signal, inclusive, are shown in FIG. 4I. In FIG. 4I, reference character (A) indicates data stored at the address A.

In the control instruction read from the instruction memory 62 by accessing its address A+1, when a jump instruction is decoded by the instruction decoder 79, the jump instruction is issued, as shown in FIG. 4D. By the status information select signal from the terminal 33 of the instruction memory 62, the multiplexor 76 and the comparator 77 achieve conditional selection to provide status information, as depicted in FIG. 4F. From the AND circuit 78, the AND data of the jump instruction (FIG. 4D) and the status information (FIG. 4F) is applied as a mode select signal (FIG. 4G) to the terminal 69 of the program counter 68 via the OR circuit 84.

When the jump instruction is "1" and the status information at that time is "1", the mode select signal to the program counter 68 becomes "1" (FIG. 4G) and a jump address B transferred from the terminal 64 of the instruction memory 62 is loaded in the program counter 68 via the multiplexor 71 at the timing of the clock shown in FIG. 4A (FIG. 4B).

The address generate instruction and the data generate instruction obtained from the instruction memory 62 are respectively decoded by decoders 81 and 82 to derive therefrom an address pattern generate instruction and a data pattern generate instruction at the terminals 29 and 31.

Figure 5:
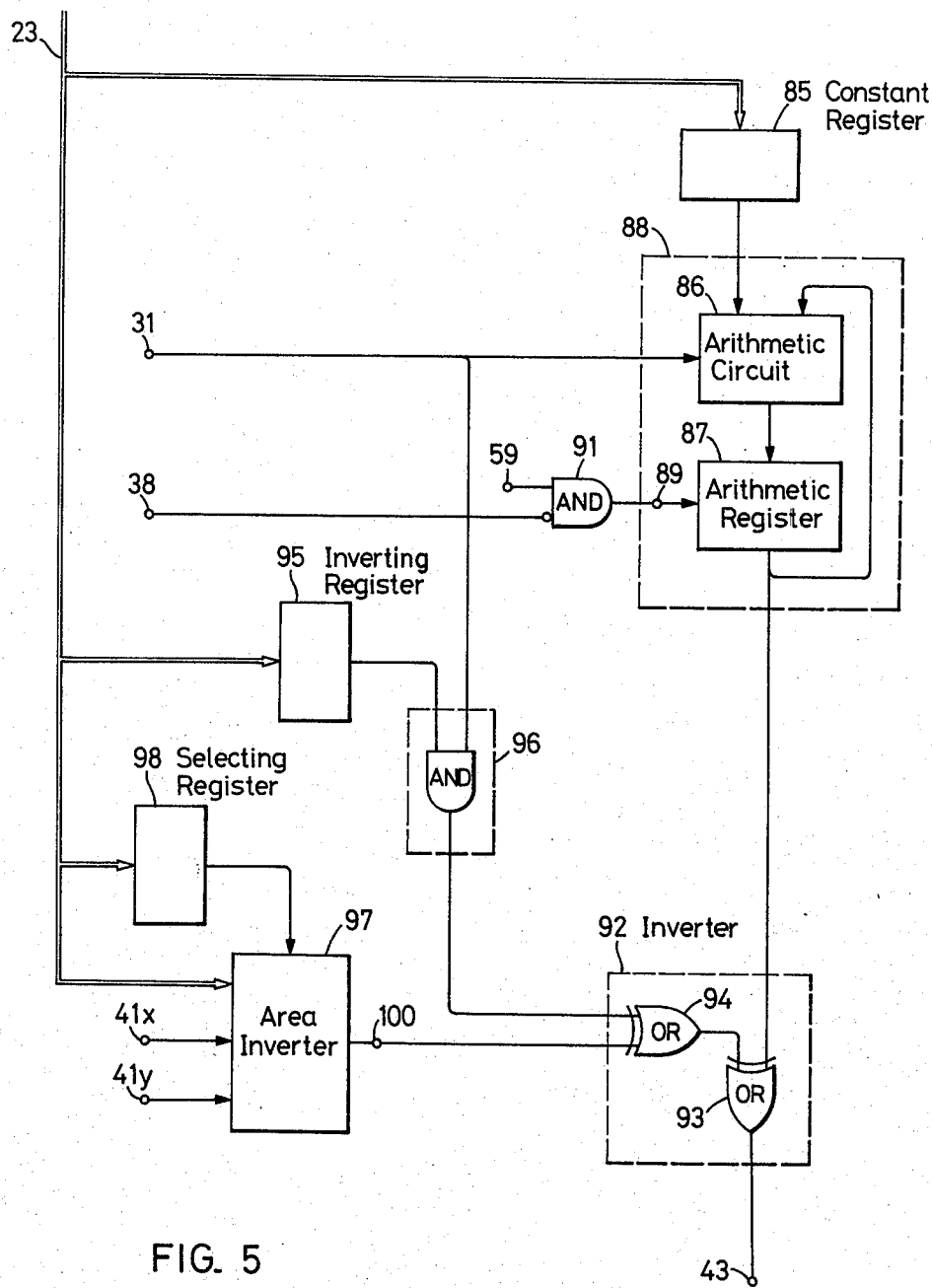
FIG. 5 is a block diagram showing an example of a data pattern generation section 27 in FIG. 2.

FIG. 5 illustrates the data pattern generation section 27, in which a constant register 85 is supplied with constant data from the electronic computer 19 via the internal bus 23. An arithmetic circuit 86 is supplied with the data pattern generate instruction from the terminal 31 of the program control section 24. The arithmetic circuit 86 responds to the data pattern generate instruction from the terminal 31 of the program control section 24 to carry out a logic operation according to the constant data of the constant register 85 and data pattern data from an arithmetic register 87, applying the results of the calculation to the arithmetic register 87. The arithmetic circuit 86 and the arithmetic register 87 make up an arithmetic unit 88. The arithmetic register 87 stores the results of calculation from the arithmetic circuit 86 at the timing of a clock from a terminal 89 and outputs a data pattern. The clock at the terminal 89 is the operation clock supplied from the terminal 59 via an AND circuit 91, which inhibits the passage therethrough of the operation clock while the buffer memory operation signal from the terminal 38 is "1". An inverter 92 has an exclusive OR circuit 93 which comprises an exclusive OR between each corresponding bit of the data pattern of the arithmetic unit 88 and the output from an exclusive OR circuit 94. The output from the inverter 92 is provided as the output of the data pattern generation section 27 to the terminal 43. To an inverting register 95 is transferred inversion data from the electronic computer 19 via the internal bus 23. When an invert instruction is added to the data pattern generate instruction at the terminal 31, the data of the inverting register 95 is applied as an inversion control signal via an AND circuit 96 to the exclusive OR circuit 94 of the inverter 92.

An area inverter 97 is supplied with row and column addresses from the address pattern generation section 26 via terminals 41x and 41y, respectively, and a select signal from a selecting register 98 and, by these inputs, yields at a terminal 100 an inversion control signal of one bit in a selection logic. The inversion control signal is applied to the exclusive OR circuit 94, which obtains the exclusive OR between the inversion control signal at the terminal 100 and each bit of the inversion control signal from the AND circuit 96.

When supplied with the data pattern generate instruction from the terminal 31 of the program control section 24, the arithmetic circuit 86 executes a specified arithmetic operation between the constant data from the constant register 85 and the data pattern from the arithmetic register 87 and provides the result of the operation. The arithmetic register 87 stores the operation result at the timing of the operation clock at the terminal 89 and outputs it as a data pattern.

The data pattern thus generated by the arithmetic unit 88 is provided to the inverter 92 and inverted by the inversion control signal from the exclusive OR circuit 94 and outputted at the terminal 43.

In the data pattern generate instruction from the terminal 31, if an invert instruction is applied to the AND circuit 96, the invert control signal is provided to the inverter 92 in connection with a bit specified by the inverting register 95. When supplied with the inversion control signal from the AND circuit 96, the inverter 92 performs an inverting operation in that bit of the data pattern from the arithmetic unit 88 to which the inversion control signal has been added, providing the inverted output as a data pattern at the terminal 43. In this manner, a desired bit in the data pattern can be selectively inverted.

Figures 6, 7:
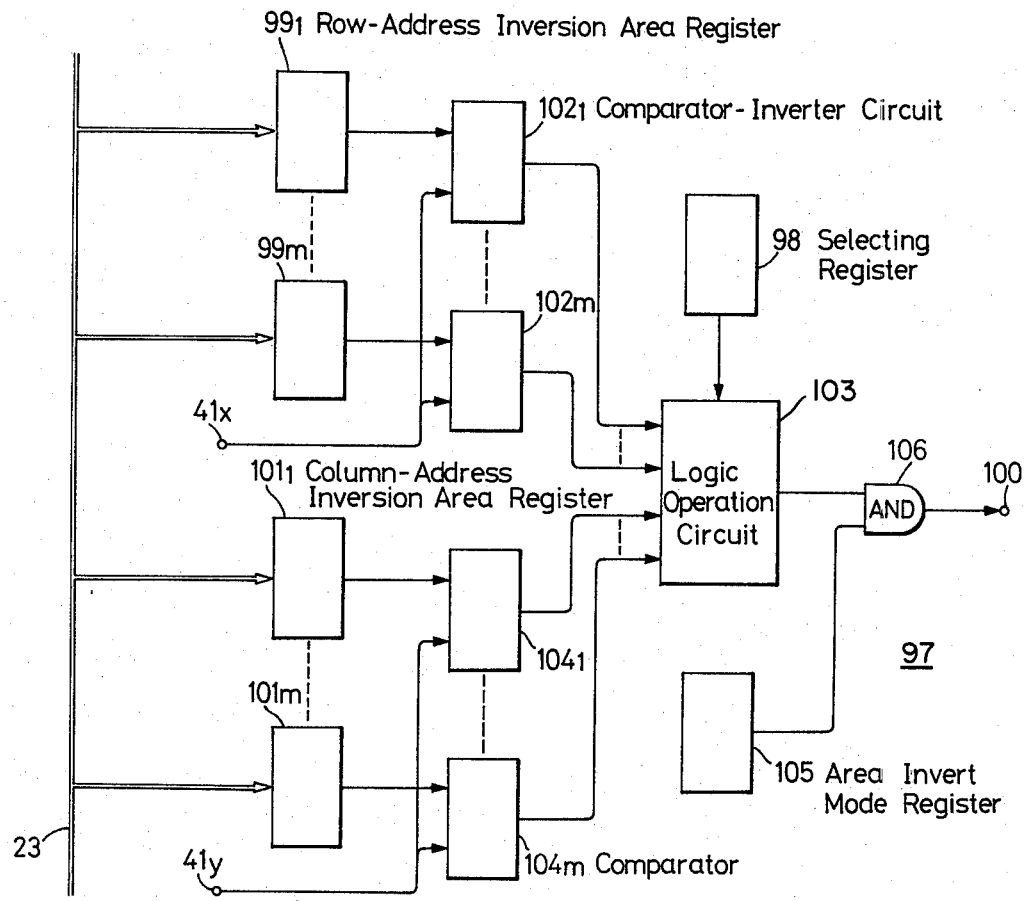
FIG. 6 is a block diagram illustrating an example of an area inversion control unit 97 in FIG. 5.
FIG. 7 is a diagram showing an example of the relationship between an address of a memory under test and a memory cell whose data is to be inverted.

An example of the area inverter 97 is shown in FIG. 6. Row-address inversion area registers $99_l$ to $99_m$ each output data indicating a row address of an inversion area, which data is transferred from the electronic computer 19 via the internal bus 23. Column-address inversion area registers $101_l$ to $101_m$ each output data indicating a column address of the inversion area, which data is similarly transferred from the electronic computer 19 via the internal bus 23.

Comparator-inverter circuits $102_l$ to $102_m$ make a comparison in magnitude between the current row address from the terminal 41x and the data of the row-address inversion area registers $99_l$ to $99_m$ and provide the results of comparison to a logic operation circuit 103. In comparators $104_l$ to $104_m$, the column address from the terminal 41y and the data of the column-address inversion area registers are compared in magnitude, and the results of comparison are applied to the logical operation circuit 103. The logic operation circuit 103 performs a logic operation based on the inputted results of comparison and the select signal from the selecting register 98, thus deriving an inversion control signal.

Where a select signal of an area invert mode register 105 is "1", the inversion control signal from the logic operation circuit 103 is provided at the terminal 100 via an AND circuit 106.

When the area inverting mode register 105 is designated to be in an invert mode, the area inverter 97 provides at the terminal 100 the inversion control signal in an area of row and column addresses predetermined by the row and column addresses from the terminals 41x and 41y and the select signal of the selecting register 98.

When the AND circuit 96 is not provided with an invert instruction from the terminal 31, upon receiving the inversion control signal from the terminal 100, the inverter 92 inverts the data of all bits of the data pattern from the arithmetic unit 88 and provides them at the terminal 43.

Turning now to FIG. 7, the operation of the area inverter 97 will be described in connection with such a 64-bit memory as shown. Consider the inversion of data for an area 107 defined by row addresses Xa to Xd and column addresses Ya to Yd, excluding an area 108 defined by the row addresses Xb to Xc and the column addresses Yb to Yc. Transferring the addresses Xa, Xb, Xc and Xd to the row-address inversion area registers $99_1$ to $99_4$ and the column addresses Ya, Yb, Yc and Yd to the column-address inversion area registers $101_1$ to $101_4$ from the electronic computer 19 via the internal bus 23, the addresses Xa, Xb, Xc and Xd and the addresses Ya, Yb, Yc and Yd are respectively applied to the comparators $102_1$ to $102_4$ and $104_1$ to $104_4$. In the comparators $102_1$ to $102_4$, the addresses Xa, Xb, Xc and Xd are respectively compared with the row address X from the terminal 41x to output the results of comparison when $Xa \leq X$, $Xb \leq X$, $Xc \geq X$ and $Xd \geq X$. The comparators $104_1$ to $104_4$ respectively compare the addresses Ya, Yb, Yc and Yd with the column address Y from the terminal 41y to output the results of comparison when $Ya \leq Y$, $Yb \leq Y$, $Yc \geq Y$ and $Yd \geq Y$.

In the logic operation circuit 103, a circuit performing a logic operation of the following logic expression is selected by the select signal from the register 98:

$$(Xa \leq X \leq Xd) \cdot (Ya \leq Y \leq Yd) \cdot \{(Xb \leq X \leq Xc) \cdot (Yb \leq Y \leq Yc)\}$$

When the condition of the logic expression is satisfied, an inversion control signal is produced. When an area invert mode is selected by the mode register 105, the inversion control signal is provided at the terminal 100 via the AND circuit 106.

Figure 8:
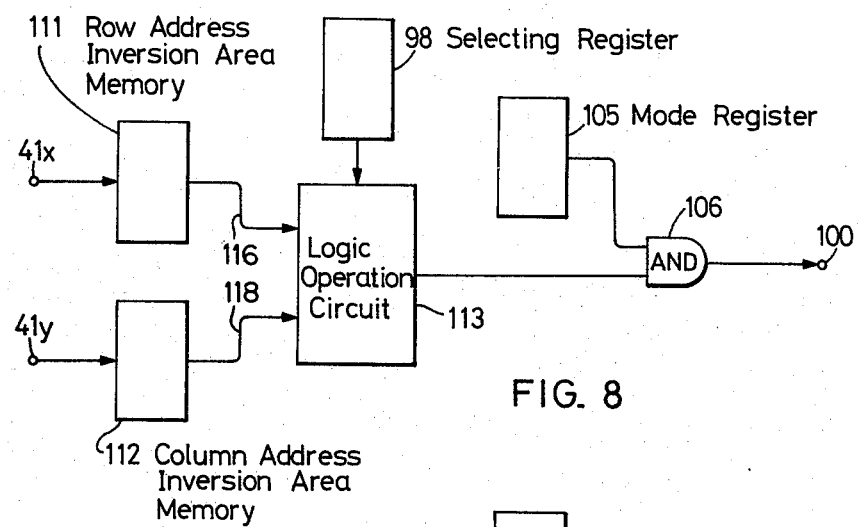
FIG. 8 is a block diagram illustrating another example of the area inversion control unit 97 in FIG. 5.
Figure 9:
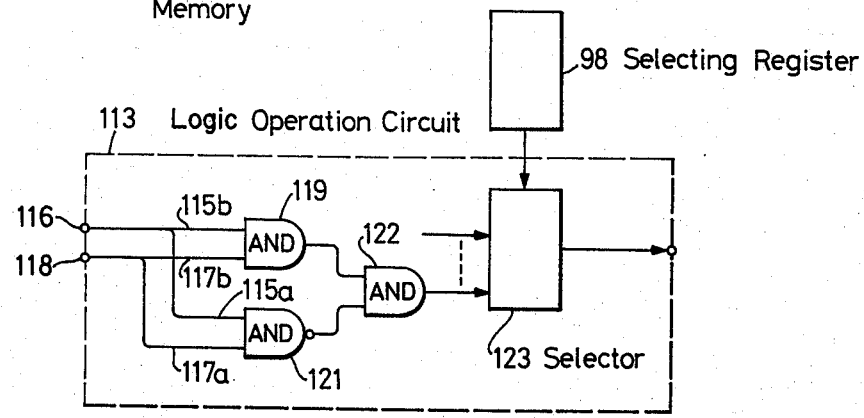
FIG. 9 is a block diagram showing an example of a select circuit 113 in FIG. 8.
Figure 10:
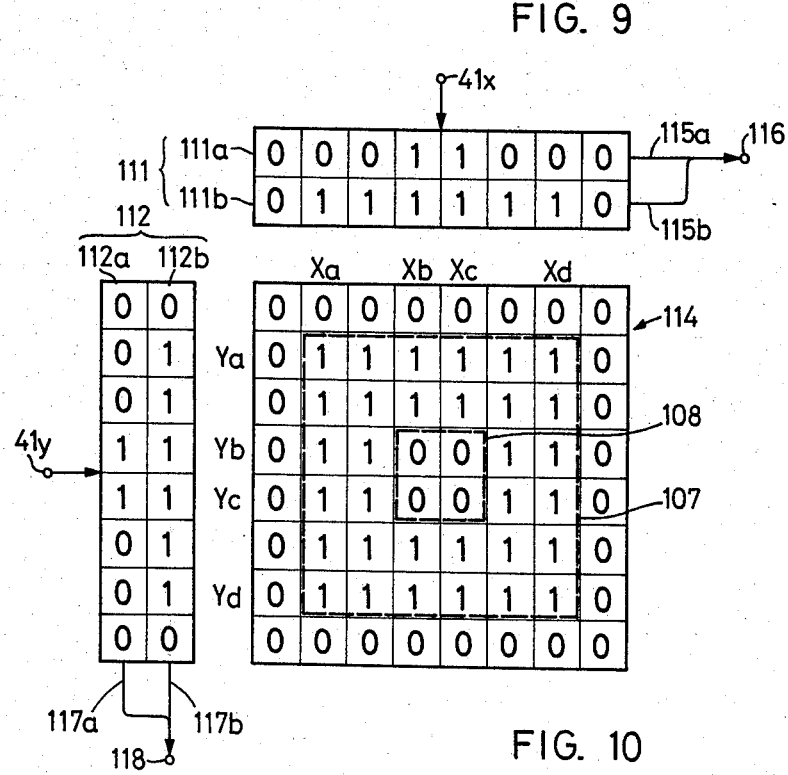
FIG. 10 is a diagram illustrating, by way of example, an address of the memory under test, its memory cell whose data is to be inverted and stored data of inversion memories 111 and 112.

Another example of the area inverter 97 is illustrated in FIG. 8. When a row-address inversion area memory 111 and a column-address inversion area memory 112 are respectively read by the row address X and the column address Y from the terminals 41x and 41y, row-address inversion data and column-address inversion data prestored in these memories 111 and 112 via the internal bus 23 are outputted therefrom. As shown in FIG. 10, in the case of inverting an area which is inside of the area 107 of a 64-bit memory 114 and outside of the area 108, as is the case with FIG. 7, memory portions 111a and 111b having bits of only row addresses are provided in the row-address inversion area memory 111 and, in the memory portion 111a, data of only the row addresses xb and xc are set to "1" and, in the memory portion 111b, data of the row addresses Xa through Xd are set to "1". For instance, when the address Xa is applied to the memory 111 from the terminal 41x, "0" and "1" are read from the memory portion 111a and 111b, respectively. The thus read data 115a and 115b are supplied to a logic operation circuit 113 from a terminal 116. In a similar manner, data of only the addresses Yb and Yc are set to "1" in a memory portion 112a of the column-address inversion area memory 112 and data of the addresses Ya through Yd are set to "1" in a memory portion 112b. Data 117a and 117b read respectively from the memory portions 112a and 112b when the column addresses from the terminal 41y are supplied to the logic operation circuit 113 from a terminal 118. In the logic operation circuit 113, as shown in FIG. 9, an AND circuit 119 is supplied with the data 115b and 117b and an AND circuit 121 is supplied with the data 115a and 117a. The outputs from the circuits 119 and 121 are applied to a circuit 122 to obtain a logic product. When the output from the circuit 122 is selected by a selector 123 in accordance with the content of the register 98, an inversion control signal is provided in an address area indicated by "1" in the memory 114 shown in FIG. 10. The inversion control signal thus produced is sent via the AND circuit 106 to the terminal 100 in FIG. 8.

In the logic operation circuit 113, it is possible to add circuits for achieving various logic operations and to select one of them by the selector 123. For example, if only the output from the AND circuit 119 is selected by the selector 123, an inversion control signal covering the entire area 107 in FIG. 10 is produced. By such a logic operation and by modifying the data in the memories 111 and 112, data for a desired continuous area or spaced areas in the memory 114 can be inverted.

Figure 11:
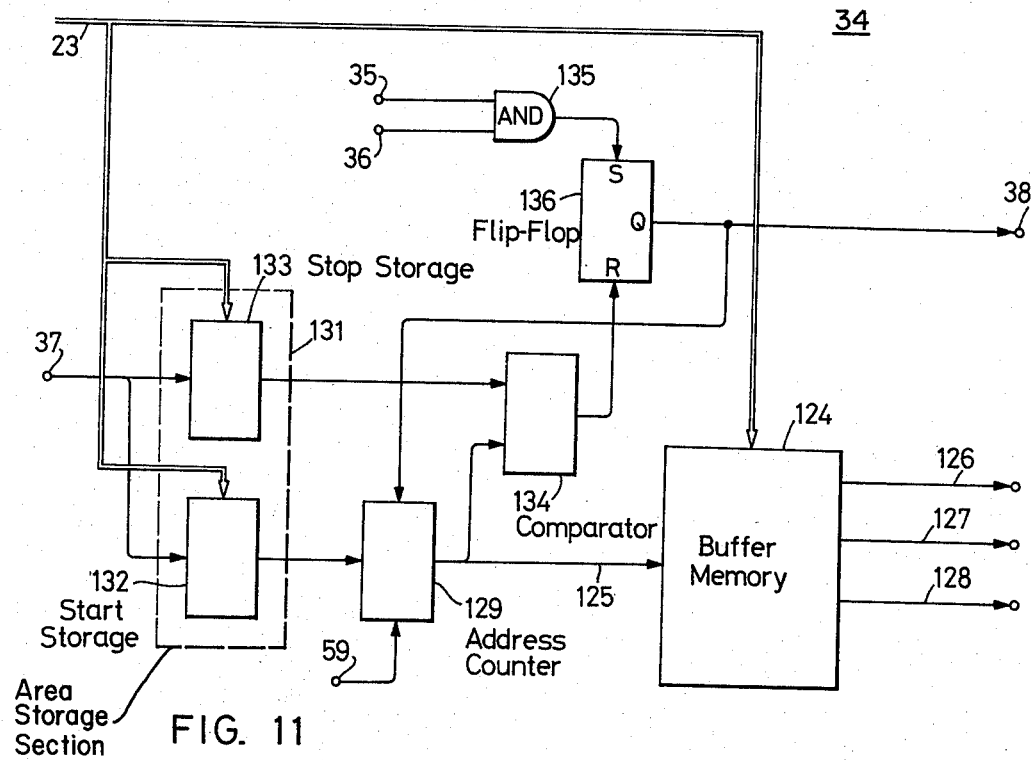
FIG. 11 is a block diagram showing an example of a buffer memory section 34 in FIG. 2.

In the buffer memory section 34, as depicted in FIG. 11, a buffer memory 124 has prestored therein address, data and memory control patterns from the electronic computer 19 via the internal bus 23. Of the prestored patterns, data accessed by a memory address 125 are outputted as an address pattern 126, a data pattern data 127 and a memory control pattern 128. When the buffer memory operation signal at the terminal 38 becomes "1", an address counter 129 loads therein a start address from a start storage 132 of an area storage 131 in synchronism with the operation clock at the terminal 59 and increments the memory address 125 in synchronism with the operation clock while the buffer memory operation signal is "1". The start storage 132 has prestored therein several kinds of start addresses supplied from the electronic computer 19 via the internal bus 23 and outputs a start address selected by a select signal from the terminal 37 of the program control section 24. Several kinds of stop addresses are prestored in a stop storage 133 of the area storage 131 as supplied from the electronic computer 19 via the internal bus 23. The stop addresses are selectively outputted in response to the select signal from the terminal 37 of the program control section 24. A comparator 134 makes a comparison between the memory address 125 from the address counter 129 and the stop address from the stop storage 133 and yields a coincidence signal when they match with each other. When a buffer memory select signal from the terminal 35 of the program control section 24 and a comparison signal from the terminal 36 are both "1", an AND circuit 135 provides a buffer memory start signal. The start signal sets a set-reset flip-flop 136 to derive a buffer memory operation signal at its terminal. The flip-flop 136 is reset by the coincidence signal from the comparator 134.

When the buffer memory select signal is detected in the program control section 24 to provide an output "1" at its terminal 35 and the comparison signal at the terminal 36 is "0", the set-reset flip-flop 136 is set via the AND circuit 136 to set the buffer memory operation signal at the terminal 38 to "1". When the buffer memory operation signal becomes "1", the start address in the start storage 132 selected by the select signal at the terminal 37 is loaded in the address counter 129 in synchronism with the operation clock at the terminal 59 and, thereafter, the address counter 129 is successively incremented to apply the memory address 125 to the buffer memory 124 and the comparator 134. When the memory address 125 matches with the stop address in the stop storage 133 selected by the select signal at the terminal 37, the comparator 134 yields a coincidence signal to reset the buffer memory operation signal in the set-reset flip-flop 136. When the buffer memory operation signal is cleared, the operation of the address counter 129 is stopped.

By the above operations, addresses between the start and stop addresses selected by the select signal at the terminal 37 are each obtained as the memory address 125 in synchronism with the operation clock at the terminal 59. In other words, patterns are continuously obtained from the address and data pattern generation sections 26 and 27 at the same speed as their operation clocks. From the buffer memory 124, the address, data and memory control patterns 126, 127 and 128 accessed by the memory address 125 thus obtained are respectively provided at the multiplexors 46, 47 and 48 in FIG. 2. Alternatively, the area storage 131 may also store the start address and the number of addresses to be read following it.

Figure 12:
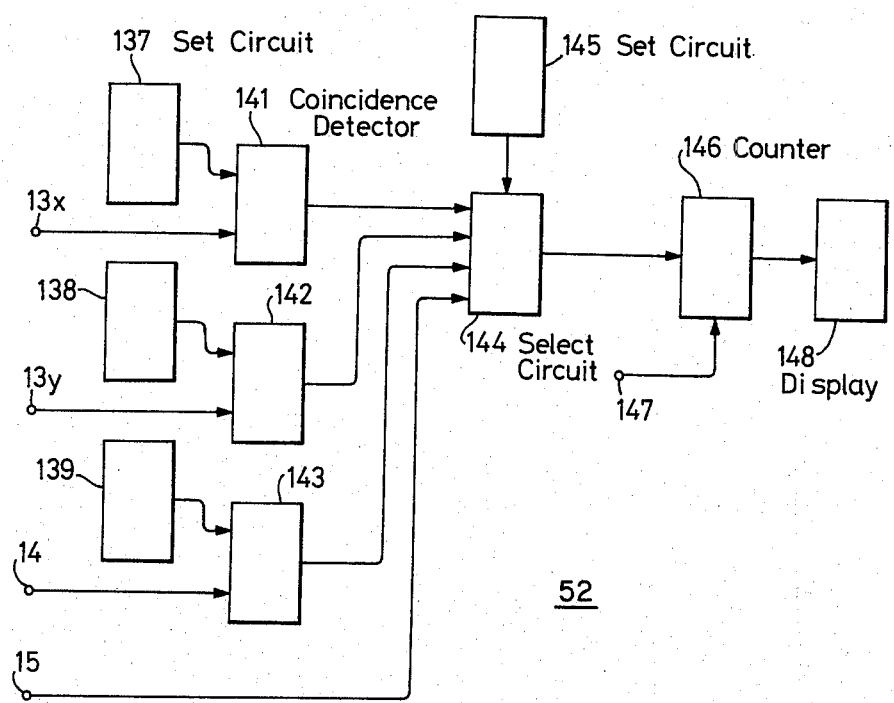
FIG. 12 is a block diagram showing an example of a trigger circuit section 52 in FIG. 2.

In the trigger circuit section 52, there are provided a set circuit 137 for determining a row address trigger point, such as a switch, a set circuit 138 for determining a column address trigger point, such as a switch, and a set circuit 139 for determining a data trigger point, such as a switch, as shown in FIG. 12. Trigger addresses and trigger data from the set circuits 137, 138 and 139 are respectively applied to coincidence detectors 141, 142 and 143 for comparison with addresses and data at terminals 13x, 13y and 14 which are applied to the memory under test, and in the case of coincidence, a coincidence signal is derived from each of the coincidence detectors 141, 142 and 143. One or more of the coincidence signals and a memory control signal at the terminal 15, which is applied to the memory under test, are selected by a select circuit 144 to produce a trigger signal. This selection is accomplished in accordance with the set state of a set circuit 145, such as a switch. In the case of a plurality of signals being selected by the select circuit 144, only when they are simultaneously obtained does the select circuit 144 provide the trigger signal. The trigger signal is counted by the counter 146, which is cleared by a clear signal occurring at a terminal 147 at the start of operation of the test pattern generating apparatus 11. The count value of the counter 146 is displayed on the display 148.

At the start of operation of the test pattern generating apparatus 11, the counter 146 is cleared and, during the operation of the test pattern generating apparatus 11 the row address, the column address data and the data pattern to be applied to the memory under test are respectively compared with the row trigger address, the column trigger address and the trigger data in the coincidence detectors 141,142 and 143, and their coincidence signals are applied to the select circuit 144. By the trigger select signal specified by the trigger set circuit 145, one or more of the inputs to the select circuit 144 are selected and the output from the select circuit 144 is provided as the trigger signal, which is counted by the counter 146 and the count value is displayed on the display 148. In such kinds of memory tests, there are some occasions when a specified combination of the address, data and memory control signal appears a plurality of times. The frequency of this combination is known in advance. Accordingly, the address and data for such a combination are preset in the set circuits 137, 138 and 139 and the trigger set circuit 145 is set so that, for example, when the memory control signal is "1", the inputs to the select circuit 144 are all "1" to provide therefrom the trigger signal. If the display on the display 148 coincides with the preknown frequency of the abovesaid combination at the end of the test, it can be presumed that the test was conducted correctly. In the case of non-coincidence, it is seen that the test was not accomplished correctly. Thus, during actual memory test, it can be checked whether it is being made correctly or not.

Figure 13:
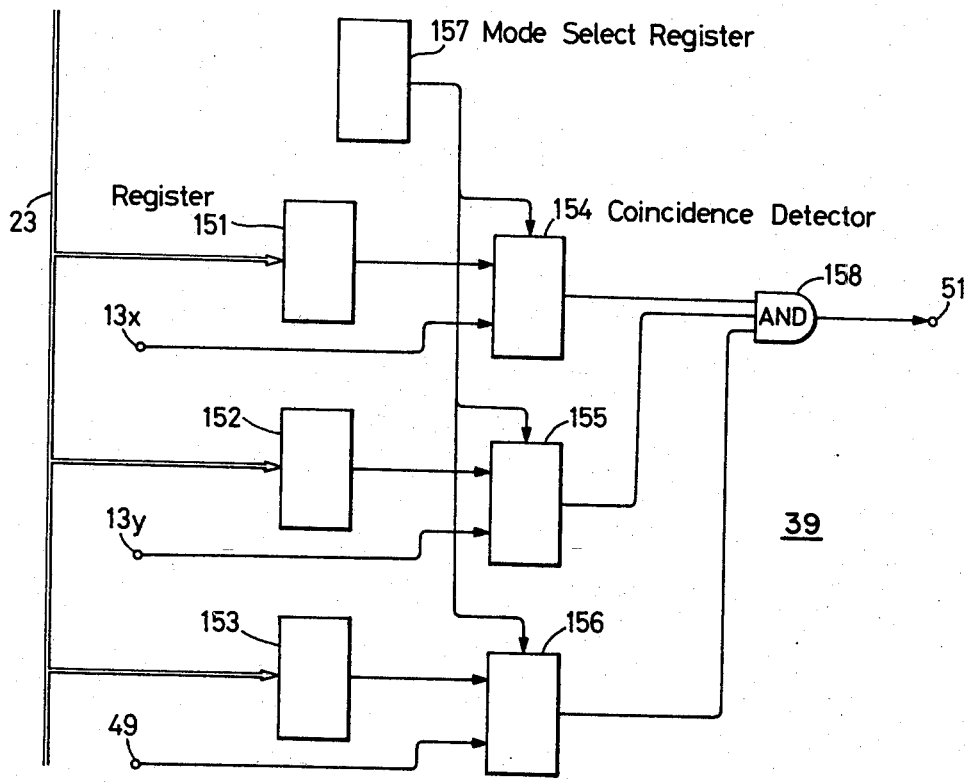
FIG. 13 is a block diagram illustrating an example of a break point control section 39 in FIG. 2.
Figure 14:
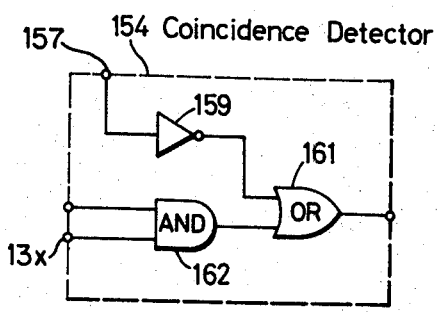
FIG. 14 is a logic circuit diagram showing an example of a select circuit 154 in FIG. 13.

In the breakpoint control section 39, for example, as shown in FIG. 13, row and column breakpoint registers 151 and 152 are respectively supplied with row and column breakpoint addresses from the electronic computer 19 via the internal bus 23. Likewise, an instruction address breakpoint is transferred to an instruction address breakpoint register 153 from the electronic computer 19 via the internal bus 23. The outputs from these registers 151, 152 and 153 are respectively compared by coincidence detectors 154, 155 and 156 with the row and column addresses from the terminals 13x and 13y to be applied to the memory under test and an instruction memory address from the terminal 49. The coincidence detectors 154, 155 and 156 are individually supplied with a selected signal from a mode select register 157. Where the select signal is "1", the coincidence detectors each provide a coincidence signal when both inputs coincide with each other, and where the select signal is "0", they always yield coincidence signals indicating the state of both inputs being coincident with each other. When the coincidence signals from the coincidence detectors 154, 155 and 156 are all "1", a stop signal is produced at an output terminal 51 of an AND circuit 158. In the coincidence detector 154, as depicted in FIG. 14, the select signal from the mode select register 157 is supplied via an inverter 159 to an OR circuit 161, the two inputs are provided to an AND circuit 162 and its output is applied to the OR circuit 161, whose output is provided as the output from the coincidence detector 154. The other coincidence detectors 155 and 156 can also be constructed similarly. Where the breakpoint addresses are respectively set in the registers 151 through 153 and the select signal to the coincidence detector 156 alone is set to "0", the stop signal occurs at the terminal 51 when the addresses to be supplied to the memory under test coincide with those stored in the registers 151 and 152. Alternately, if only the select signal to the coincidence detector 156 is made "1", the stop signal occurs at the terminal when the address for the instruction memory of the program control section 24 coincides with the content of the register 153. When the stop signal is applied from the terminal 51 to the internal timing generation section 55, the operation of the test pattern generating apparatus 11 is stopped. The stop signal is also applied via the interface section 22 to the electronic computer 19 to inform that the stop is based on the breakpoint. Thereafter, a pattern trace is initiated. In this way, the pattern can be caused to proceed rapidly to the pattern trace starting point.

Figure 15:
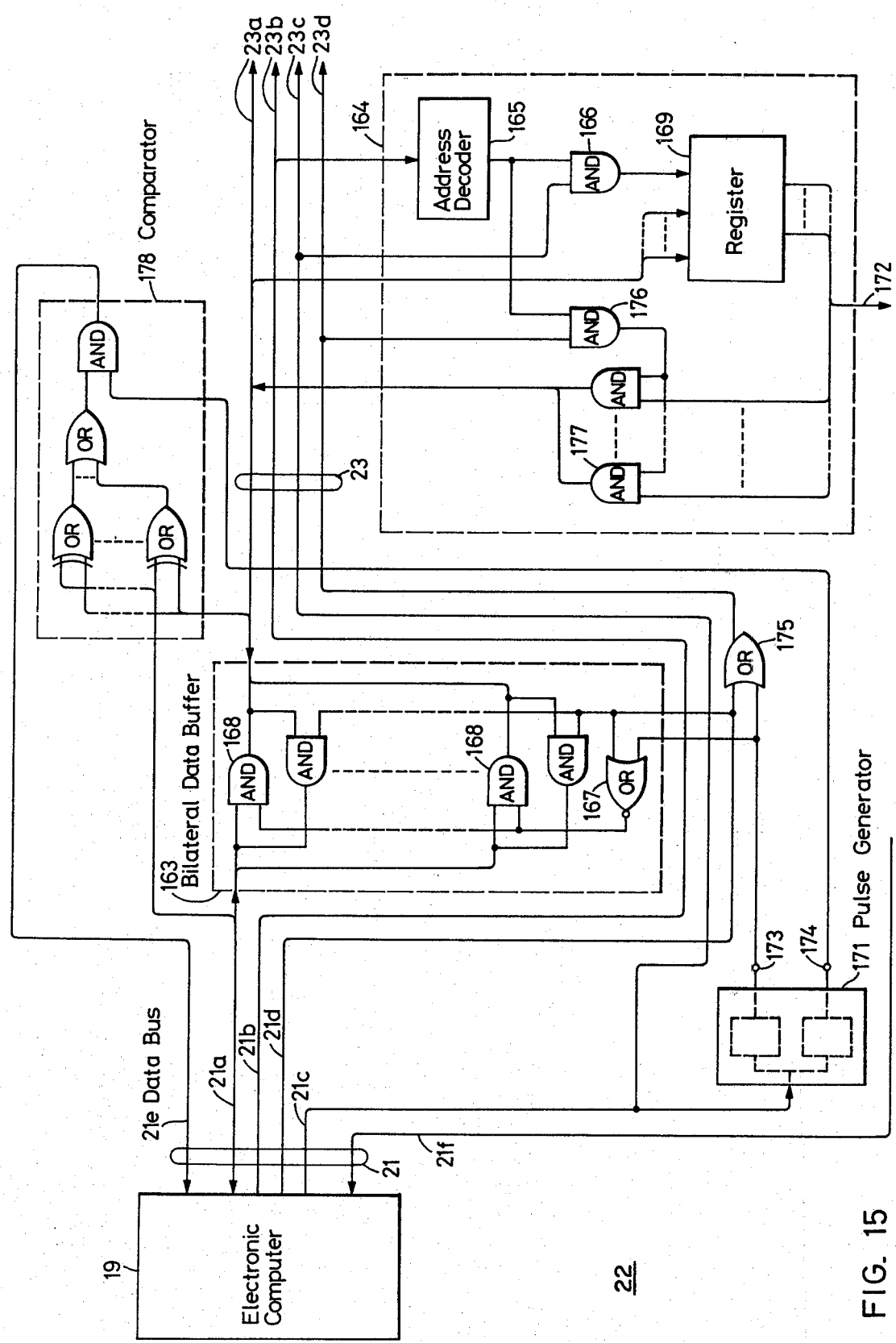
FIG. 15 is a block diagram illustrating an example of an interface section 22 in FIG. 2.

FIG. 15 shows an example of the interface section 22. The data bus 21 interconnecting the electronic computer 19 and the test pattern generating apparatus 11 comprises an n-bit data line 21a for data transfer and readout, an address line 21b for transmitting an address for specifying a register to which data is transferred or from which data is read, a command line 21c for sending a signal indicating data transfer, a read command line 21d for sending a signal indicating readout and control lines 21e and 21f for sending control signals.

The data line 21a is connected with a data line 23a of the internal bus 23 via a bilateral data buffer 163. The data buffer 23a transfers data of the data line 21a to the data line 23a or data of the latter to the former in dependence upon whether the read command line 21d is "0" or "1". The other lines of the bus 21 are respectively connected to the corresponding lines of the bus 23.

Figure 16A:
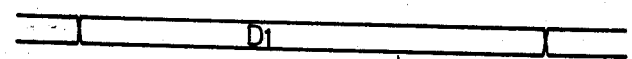
FIGS. 16A–16H set forth a time chart explanatory of the operation of the interface section of FIG. 15.
Figure 16B:
Figure 16C:
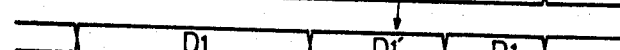
Figure 16D:
Figure 16E:
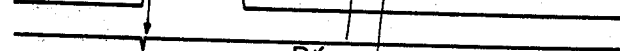

The registers included in the test pattern generating apparatus 11 are all identical in construction with a register 164 and connected to the internal bus 23. In the register 164, an address decoder 165 is provided which decodes the address on the address line 23b of the internal bus 23 and provides a register select signal to an AND circuit 166 when the register 164 is selected. During data transfer, data D1 is transferred via the data line 21a to the bilateral data buffer 163 from the electronic computer 19, as depicted in FIG. 16A. In the data buffer 163, since the read command line 21d is "0", a gate 168 is opened via a NOR gate 167 to pass on the data D1, as it is, to the data line 23a of the internal bus 23 (FIG. 16C). The data D1 on the data line 23a is provided, as it is, to a register 169 of the internal register 164. On the other hand, from the electronic computer 19, an address A1 (FIG. 16B) indicating the address of the internal register 164 and a transfer command (FIG. 16D) are respectively applied to the address lines 21b, 23b and 21 c and 23c at the timings shown in FIG. 16. The address A1 is provided, as it is, to the address decoder 165 of the internal register 164, and in the case of the register 164 being selected, the address decoder 165 supplies a select signal to the AND circuit 166. The abovesaid transfer command is applied via the internal bus 23 to the AND circuit 166 of the internal register 164 and a pulse generator 171. The transfer command provided to the internal register 164 is ANDed with the select signal in the circuit 166 and, in the case of the internal register 164 being selected, the data D1 on the data line 23a is transferred to the register 169 at the timing of the transfer command (FIG. 16D) and the transferred data is outputted as register data 172 (FIG. 16E).

Figure 16F:
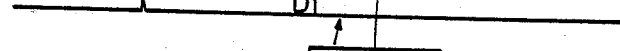
Figure 16G:
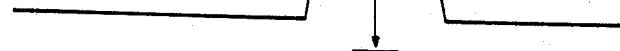
Figure 16H:

On the other hand, in response to the transfer command, the timing generator 171 provides a read pulse and a strobed pulse at terminals 173 and 174 respectively at the timings shown in FIGS. 16F and G. The read pulse is applied to the NOR gate 167 of the data buffer 163 and, at the same time, applied as a read signal to the internal register 164 via an OR circuit 175 and a read command line 23d. When supplied with the read pulse, the bilateral data buffer 163 inhibits data transfer from the data line 21a to the data line 23 while the read pulse is applied to the data buffer 163. In the internal register 164, when it is selected, gates 177 are opened via a gate 176 during the period of the read signal, by which the data (FIG. 16E) transferred to the register 169 is applied to the bus line 23a (FIG. 16C). As a consequence, during the period of the read pulse the data line 21a is supplied with the data D1 to be transferred therethrough, whereas the data line 23a is supplied with the data D1' transferred to the internal register 164. In a comparator 178, the data D1 on the data line 21a and the data D1' transferred to the internal register 164 are compared at the timing of the strobed pulse (FIG. 16G) and, in the case of non-coincidence, a control signal indicating that the data D1 is not correctly transferred to the internal register 164 is applied via the control line 21e to the electronic computer 19.

By the above operations, in the transfer of the data D1 to the internal register 164 from the electronic computer 19, it can be checked by the signal on the control line 21e whether or not the data transfer was accomplished correctly in one transfer cycle.

FIG. 17 illustrates an example of the page mode control section 53. The row and column addresses from the address multiplexor 46 are respectively stored in row and column address registers 181 and 182 at the timing of the operation clock provided at the terminal 59. In a computer 183 are compared the current row address from the multiplexor 46 and the row address from the row address register 181 (the row addresses in the immediately preceding period) and, if they do not coincide with each other, the comparator 183 provides a non-coincidence signal. The non-coincide signal is read in a register 184 with the clock at the terminal 59. By the non-coincidence signal, a gate 185 is opened, through which a clock from a terminal 59' is applied as a control signal to a switching circuit 186. The switching circuit 186 applies to a switching circuit 187 the row address from the register 181 while the control signal is "1" and the column address from the register 182 while the control signal is "0". To a mode register 188 is transferred a mode select signal from the electronic computer 19 via the internal bus 23. The switching circuit 187 outputs the data of the switching circuit 186 or the address of the register 181 to the terminal 13x in dependence upon whether the mode select signal is "1" or "0". While the mode select signal is "0", a gate 189 is opened to pass on the column address from the register 182 to the column address terminal 13y.

FIG. 18 shows a timing chart of the operation of the page mode control section 53 depicted in FIG. 17. When respectively supplied with the row address (FIG. 18B) and the column address (FIG. 18D) from the multiplexor 46, the row address register 181 and the column address register 182 produce, in synchronism with the operation clock at the terminal 59 (FIG. 18A), a row address (FIG. 18C) and a column address (FIG. 18E) respectively delayed behind the abovesaid ones by one period. The comparator 183 drives the non-coincidence signal (FIG. 18F) at the terminal 54 when those of the thus obtained addresses which are inputted and outputted from the address register 181 are not coincident with each other. The register 184 produces a non-coincidence signal (FIG. 18G) delayed behind that of FIG. 18F by one period. The AND gate 185, when supplied with the non-coincidence signal from the register 184, supplies the switching circuit 186 with the clock (FIG. 18H) from the terminal 59' (FIG. 18I). While the control signal clock (FIG. 18I) is "1", the switching circuit 186 outputs a row address $X_1'$ from the register 181, as shown in FIG. 18J, and while the control signal clock is "0", the switching circuit 186 outputs column addresses $Y_0'$, $Y_1'$ and $Y_2'$. The output data (FIG. 18J) thus obtained from the switching circuit 186 is selected by the mode select signal from the mode register 188 and provided via the switching circuit 187 to the row address terminal 13x. When the abovesaid output data is not selected by the mode register 188, the row address and the column address are respectively provided from the registers 181 and 182 to the terminals 13x and 13y.

To the timing generator 56, the non-coincidence signal from the comparator 183 is supplied as a timing changeover signal via the terminal 54 and, in a period Ta following the application of the non-coincidence signal, the timing generator 56 generates an operation clock different from the preceding one.

Thus, in the case where the external address terminals of the memory under test are used in common to both row and column addresses, "1" is stored in the mode register 188 and addresses are supplied to the memory under test from the terminal 13x alone. In such a case, the row address X and the column address Y are alternately to the terminal 13x other in one period, but if the same row address continues, only the column address is applied to the terminal 13x; namely, the page mode test is automatically conducted. The operating clock period $t_b$ during the page mode test is selected shorter than the period $t_a$ when the row and column addresses are switched over to alternately outputted.

Figure 19:
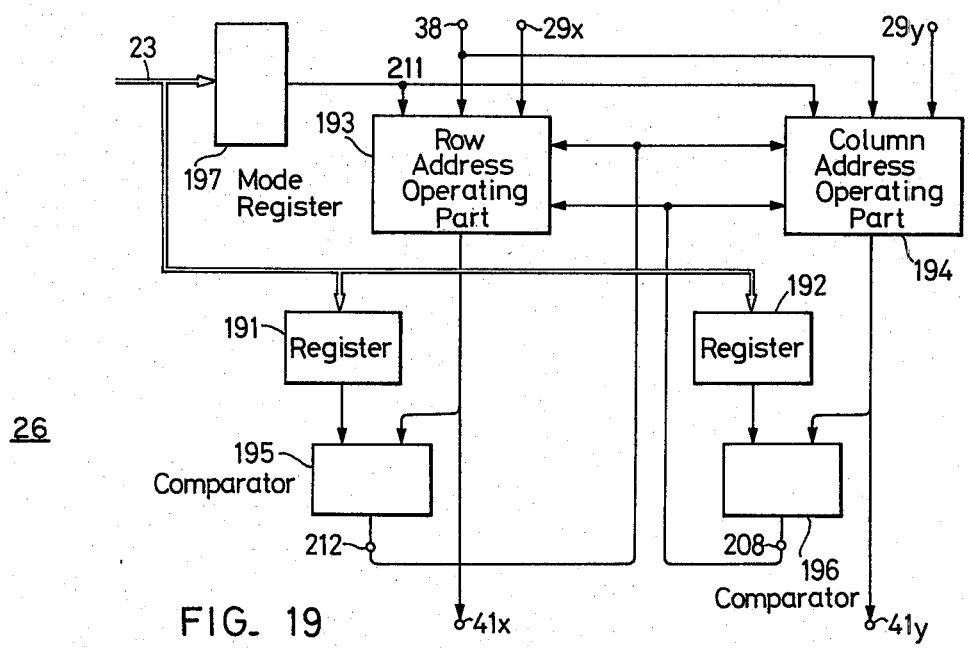
FIG. 19 is a block diagram showing an example of an address pattern generation section 26 in FIG. 2.

FIG. 19 illustrates in block form the address pattern generation section 26. In the illustrated example, row and column addresses are generated, and an address indicating a maximum value of the row address and an address indicating a maximum value of the column address are respectively transferred via the internal bus 23 to a row maximum value register 191 and a column maximum value register 192 from the electronic computer 19. A row address pattern from a row address operating part 193 for generating a row address by calculation and a column address pattern from a column address calculation part for generating a column address by operation are respectively compared by comparators 195 and 196 with the row maximum address and the column maximum address from the registers 191 and 192. Where they coincide with each other, coincidence signals are respectively applied to the row and column address operating parts 193 and 194. The mode of operation of the address operating parts 193 and 194 is selected by the output from a mode register 197, which is set by the electronic computer 19 via the internal bus 23.

Figure 20:
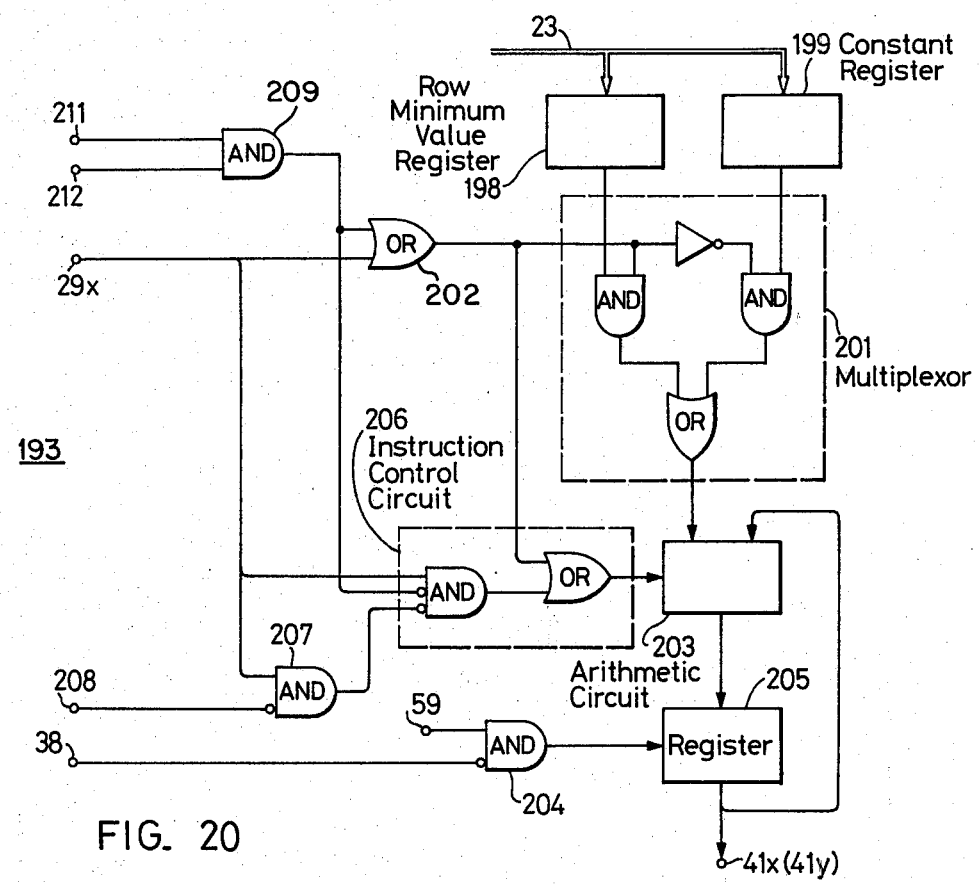
FIG. 20 is a block diagram illustrating an example of a row address operation unit 193 in FIG. 19.

In the address operating part 193, for example, as shown in FIG. 20, the minimum value of the row address is transferred via the internal bus 23 to a row minimum value register 198 from the electronic computer 19. The operand necessary for the row address generation is placed in a constant register 199 and this is also transferred from the electronic computer 19. In a multiplexor 201, when a minimum value select signal from an OR circuit 202 is "0", the operand in the constant register 199 is applied as the operand stored in the constant register 199 to an arithmetic circuit 203. The result of operation of the arithmetic circuit 203 is stored in an arithmetic register 205 with the output clock from an AND circuit 204 and provided as a row address at a terminal 41x. In the arithmetic circuit 203, an operation specified by an operate instruction from an instruction control circuit 206 is executed between the operand stored in the constant register 199 supplied from the multiplexor 201 and the address from the register 205. When a concatenate instruction is applied to an AND circuit 207 in response to a row address pattern generate instruction from a terminal 29x, if the output coincidence signal of the comparator 196 from a terminal 208 is "0", that is, in the case of of noncoincidence, an instruction inhibit signal is applied to an instruction control circuit 206. The instruction control circuit 206 provides an operate instruction to the arithmetic circuit 203 when the minimum value select signal from the OR circuit 203 is "1". Further, when the row address pattern generate instruction is applied to the terminal 29x, the operate instruction is provided to the arithmetic control 203, but this operation is inhibited by instruction inhibit signals from the AND circuit 207 and an AND circuit 209. The AND circuit 209 obtains the logical product of the operation mode "1" from the mode register 197 provided at a terminal 211 and the coincidence signal of the comparator 195 from a terminal 212 to produce an operation inhibit signal. The column address operating part 194 has also the same construction as the row address operating part 193.

To facilitate a better understanding of the above said operations, let it be assumed that the memory under test is such a 16-bit memory as shown in FIG. 21. A row address decoder 213 decodes the row address provided at the terminal 41x and, in accordance with the result of decoding, selects a row direction address of memory cell matrix 214. The column address decoder 215 decodes the column address derived at the terminal 41y and, in accordance with the result of decoding, selects a column-direction address of the memory cell matrix 214. Data can be read from or written in the memory cell selected by the two outputs from the address decoders 213 and 215. In FIG 22 there are shown addresses necessary for accessing the memory of FIG. 21 in the order of its memory cells $M_1$ to $M_{16}$.

The operation of the address pattern generation section 26 will be described in respect of the generation of the address sequence shown in FIG. 22. Before starting the pattern generation, the maximum values (11) and the minimum values (00) of the row and column addresses necessary for the address pattern generation are respectively transferred to the row maximum value register 191, the column maximum value register 192, the row minimum value register 198 and a column minimum value register (not shown) from the electronic computer 19 via the internal bus 23. Further, the operand value necessary for the address pattern generation is also transferred via the internal bus 23 to the constant register 199 from the electronic computer 19. To the instruction memory of the program control section 24, a program having the sequence shown in FIG. 23 is transferred via the internal bus 23 from the electronic computer 19 for the generation of the address pattern depicted in FIG. 22. The sequence of an instruction 218 in FIG. 23 is shown in FIG. 24. When an operation clock is provided by the abovesaid operation at the moment completion of of the transfer of data to the registers and the program to the instruction memory, generation of the address pattern is initiated.

Upon initiation of generation of the address pattern, an instruction 216 in FIG. 23 is transferred to the row and column address operating parts 193 and 194 via terminals 29x and 29y, respectively. In each of the address operating parts 193 and 194, the select signal from the OR circuit 202 becomes "1" to apply the content of the minimum value register 198 as the operand to the arithmetic circuit 203 via the multiplexor 201. At the same time, this minimum value select signal is also applied to the instruction control circuit 206, from which is provided to the arithmetic circuit 203 an operate instruction direction it to output the abovesaid operand as the result performing the calculation. The calculation result thus obtained is applied to the register 205, which holds the operation result at the timing of the output clock from the gate 204. As a consequence, the row and column addresses at the terminals 41x and 41y respectively have the contents "00" and "00" of the row and column minimum value registers.

Next, upon application of an instruction 217 from the instruction memory, in the row address operating part 193, the output select signal from the OR circuit 202 becomes "0" and the content of the constant register 199 is applied as the operand to the arithmetic circuit 203. The row address pattern generate instruction at the terminal 29x directs the arithmetic circuit 203 via the instruction control circuit 206 to add the number of operations and the address of the register 205. In response to this instruction,, the arithmetic circuit 203 performs the addition and applies the result of the addition to the register 205. The register 205 stores and outputs the result of the calculation as a row address at the timing of the output clock from the AND gate 204.

Where identical instructions are successively applied from the instruction memory, the row address from the register 205 is successively added with 1 and outputted. When the row address X becomes equal to the content XMAX of the maximum value register 191 as a result of repetition of the above-described operation, the comparator 195 provides a coincidence signal for input to the address operating parts 193 and 194. In the row address operating part 193, when supplied with the coincidence signal from a terminal 212 and a mode signal from a terminal 211 of the mode register 197, an instruction inhibit signal is applied from the AND circuit 209 to the instruction control circuit 206 to inhibit the address generate instruction from the terminal 29x. At the same time, the instruction inhibit signal is provided as a minimum value select signal to the multiplexor 201 and the instruction control circuit 206 via the OR circuit 202, by which the content XMIN of the minimum value register 198 is loaded in the register 205. As a result of this, the row address X becomes equal to the row minimum value data XMIN and the coincidence signal at the terminal 212 is removed and, in the row address operating part 193, the add instruction is executed again. In this manner, there is provided at the terminal 41x the data between the minimum and maximum values XMIN and XMAX respectively indicated by the minimum and maximum value registers 198 and 191.

Since the column address operating part 194 is identical in construction with the row address operating part 193, its operation will be described on the assumption that FIG. 20 shows the column address operating part 194. When the column address operating part 194 is supplied with the instruction 217, a concatenate instruction is applied from the terminal (29y) to the AND circuit 207 and while a coincidence signal from the comparator 196 is "0", the add instruction in the instruction control circuit 206 is inhibited by an inhibit signal from the AND circuit 207, so that no operation takes place in the arithmetic circuit 203.

Upon application of the coincidence signal from the comparator 195 to the column operating part 194, the inhibit signal from the AND signal 207 is removed and an operate instruction for addition is applied from the instruction control circuit 206 to the arithmetic circuit 203, which executes the addition of the column address Y from the address register 205 and the constant from the constant register 199 and applies the result of addition to the column address register 205. The column address register 205 outputs the result of addition as the address Y to the terminal 41y at the timing of the output clock from the gate 204.

When the column address Y, thus successively added, coincides with the column maximum value YMAX from the column value register 192, the comparator 196 applies a coincidence signal to each of the address operating parts 193 and 194. In the column address operating part 194, when supplied with the coincidence signal via the terminal 208, a column minimum value select signal becomes "1" to apply the content YMIN of the column minimum value register 198 via the multiplexor 201 and the arithmetic circuit 203 to the column register 203, from which the abovesaid content YMIN is outputted as the column address Y. By applying the row and column addresses X and Y thus obtained to the address decoders 213 and 215, respectively, the memory cell matrix 214 is accessed in the sequence shown in FIG. 22.

In the case of achieving such address generation only under program control, the program length increases, and consequently the processing time also increases and, in addition, a large capacity memory is needed as an instruction memory for storing the program. In the present invention described above, however, maximum value registers and comparators are provided, by which when the current row address coincides with a maximum value, a coincidence signal is automatically produced to perform the calculation of the column address; therefore, an address pattern can be generated with a small program length and at high speed.

Figure 25:
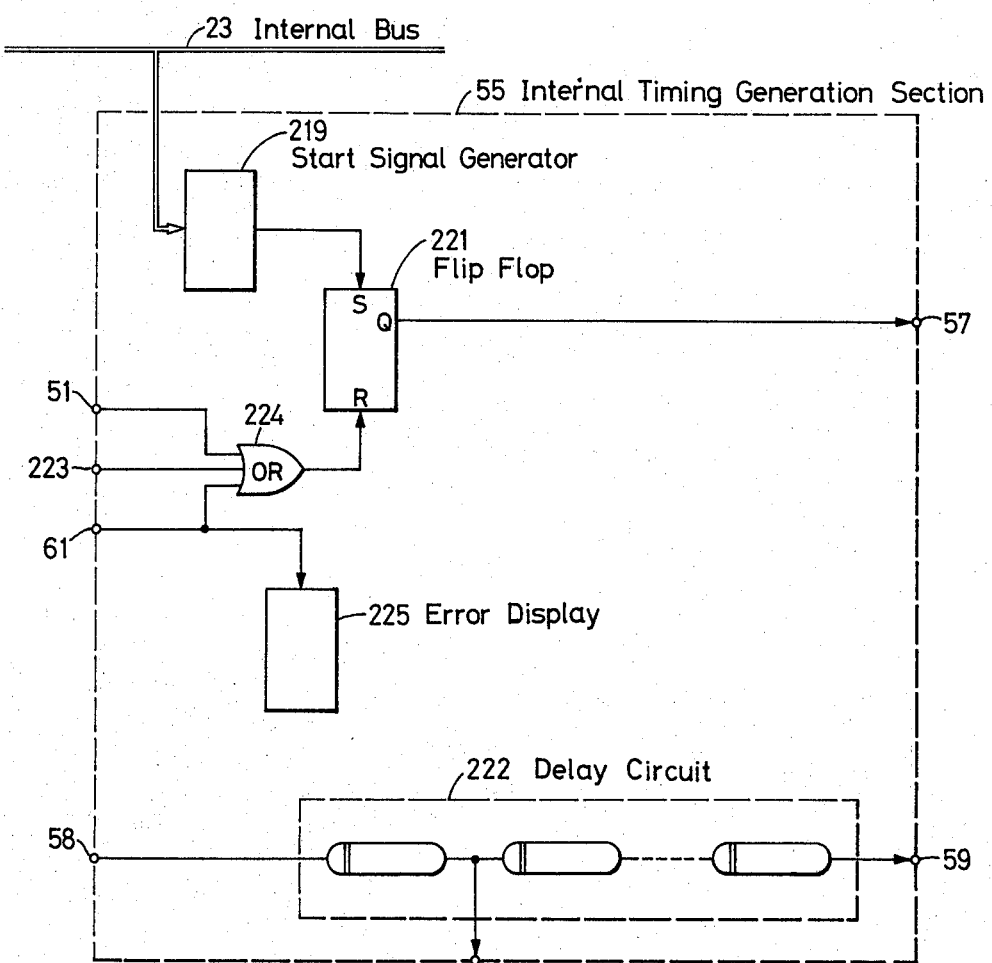
FIG. 25 is a block diagram illustrating an example of an internal timing generation section 55 in FIG. 2.

FIG. 25 illustrates in block form the internal timing generation section 55. Upon application of a start instruction from the electronic computer 19 via the internal bus 23, a start signal generator 219 yields a start signal to set a flip-flop 221. Its set output is transferred as a pattern generator operate signal to the timing generator 56 (FIG. 2) from the terminal 57. The timing generator 56 provides a clock at the terminal 58. This clock is supplied to a delay circuit 222 of the internal timing generation section 55 to derive therefrom at the terminals 59 various operation clocks of predetermined delay times. These operation clocks are applied to the respective sections of the test pattern generating apparatus 11 to start its operation. Upon application of a halt instruction from a terminal 223 of the program control section, a halt signal from the terminal 51 of the breakpoint control section or an error signal from the terminal 61 of the memory under test, the flip-flop 221 is cleared via an OR circuit 224, resulting in the operation signal at the terminal 57 becoming "0". Then, the timing generator 56 stops its operation to stop the clock at the terminal 58. As a result of this, the operation clocks at the terminal 59 are inhibited to halt the operation of the test pattern generating apparatus 11. The error signal at the terminal 61 is also supplied to a display 225 to provide an error display.

In the above, the constructions of the respective sections described above need not always be used as they are; namely it is possible to employ the new construction for any one of the sections and conventional constructions for the other remaining sections. In other words, the test pattern generating apparatus comprises at least the program control section 24, the status information generation section 25, the address pattern generation section 26, the data pattern generation section 27, the control signal generation section 28 and the internal timing generation section 55 and these sections may be the same as those used in the prior art and one or more of the buffer memory section 34, the breakpoint control section 39, the trigger circuit section 52 and the page mode control section 53 may be added. Further, it is also possible to achieve the data inversion in the data pattern generation section 27 of the construction described previously and adopt conventional structures for the other sections. The same is true of the other improved portions.

It will be apparent that many modifications and variations may be effected without departing from the scope of novel concepts of this invention.

What is claimed is:

1. A test pattern generating apparatus comprising:
    a program control section comprising an instruction memory into which is loaded a microprogram for determining a test pattern to be generated by the test pattern generating apparatus, means for reading the loaded microprogram, for interpretation and execution, and for outputting an address pattern generate instruction, a data pattern generate instruction, a memory control instruction and a status information select instruction, and means for receiving status information to control the order of the execution of the microprogram;
    an address pattern generation section connected to the program control section and comprising means for receiving therefrom the address pattern generate instruction and means for performing an arithmetic operation in response thereto for generating an address pattern;
    a memory control signal generation section connected to the program control section and comprising means for receiving therefrom the memory control instruction and means for generating memory control signals responsive thereto;
    a status information generation section connected to the program control section and comprising means for receiving therefrom the status information select instruction and for receiving from selected components of said generating apparatus a plurality of data including at least the address pattern from the address pattern generation section, said status information comprising said address pattern data in a form derived from said microprogram, and said status information generation section comprising means for comparing the two sets of address pattern data to provide the result of comparison as the status information to the program control section in response to the status information select information; and
    a data pattern generation section connected to the program control section and the address pattern generation section and comprising
        an arithmetic operation part which is supplied with the data pattern generate instruction, said arithmetic operation part comprising means for performing an arithmetic operation in response to the data pattern generate instruction for generating a data pattern,
        an area inversion control signal generator comprising means for receiving the address pattern from the address pattern generation section and means for generating an inversion control signal selectively indicating inversion of the data pattern in accordance with the address pattern, and
        an inverter connected to the output of the area inversion control signal generator and of the arithmetic operation part to selectively invert the data pattern from the arithmetic operation part dependent upon the inversion control signal to provide output data corresponding to the test pattern of said generating apparatus.

2. A test pattern generating apparatus according to claim 1, wherein the area inversion control signal generator comprises an inversion area specifying memory and means for reading the inversion area specifying memory by addressing with the address pattern inputted from the address pattern generation section and for outputting the inversion control signal on the basis of the output read from the memory.

3. A test pattern generating apparatus according to claim 2 comprising means for reading the inversion area specifying memory when selected ones of the inputted address pattern are limited to a selected one of the row and column addresses.

4. A test pattern generating apparatus according to claim 2, wherein the inversion area specifying memory comprises a row specifying memory and a column specifying memory respectively read with a row address and a column address in the address pattern, and operation circuit having means for receiving outputs read from the row specifying memory and the column specifying memory and for performing a selected logic operation for producing the inversion control signal.

5. A test pattern generating apparatus according to claim 4, wherein the logic operation circuit comprises a plurality of logic operation parts for performing different logic operations, and a select circuit for selectively providing the output of one of the logic operations from the logic operation parts as the inversion control signal.

6. A test pattern generating apparatus according to claim 1, wherein the area inversion control signal generator comprises an inversion area specifying register for storing data specifying an inversion area and a comparator for comparing the content of the register with the address pattern to provide the inversion control signal.

7. A test pattern generating apparatus according to claim 6, wherein there are provided a plurality of sets of such inversion area specifying registers and comparators corresponding thereto and a logic operation circuit for achieving a logic operation of the outputs from the comparators to obtain the inversion control signal.

8. A test pattern generating apparatus according to claim 1, wherein the area inversion control signal generator comprises a plurality of row inversion area specifying registers, each having stored therein data specifying a row address, a plurality of column inversion area specifying registers, each having stored therein data specifying a column address, a plurality of row comparators for comparing the contents of the plurality of row inversion area specifying registers with the row address of the input address pattern from the address pattern generation section, a plurality of column comparators for comparing the contents of the plurality of column inversion area specifying registers with the column address of the address pattern from the address pattern generation section, and a logic operation circuit supplied with the outputs from the pluralities of row and column comparators to achieve a logic operation to obtain the inversion control signal.

9. A test pattern generating apparatus comprising:

a program control section comprising an instruction memory into which a microprogram describing a test pattern to be generated is loaded, means for reading the microprogram for interpretation and execution, and means for outputting an address pattern generate instruction, a data pattern generate instruction, a memory control instruction and a status information select instruction and for receiving status information to control the order of execution of the microprogram;

an address pattern generation section connected to the program control section and comprising means for receiving therefrom the address pattern generate instruction and means for conducting an arithmetic operation in response thereto to generate an address pattern;

a memory control signal generation section connected to the program control section and comprising means for receiving therefrom the memory control instruction to generate a memory control signal;

a status information generation section connected to the program control section and comprising means for receiving therefrom the status information select instruction and for receiving from selected components of said generating apparatus a plurality of data including at least the address pattern from the address pattern generation section, said status information comprising said address pattern data in a form derived from said program, and means for comparing the two sets of address pattern data to provide the result of comparison as the status information to the program control section in response to the status information select information; and a data pattern generation section which is connected to the program control section and comprises
an arithmetic operation part supplied with the data pattern generate instruction to achieve an arithmetic operation in response to the instruction to generate a data pattern,
an inversion bit specifying register having stored therein data specifying bits to be inverted in the data pattern,
an inverter supplied with the bit contents of the inversion bit specifying register to invert the specified bits in the data pattern from the arithmetic operation part, and
a gate controlled by the data pattern generate instruction to control the supply of the contents of the inversion bit specifying register to the inverter.

10. A test pattern generating apparatus having at least one operation clock and comprising:

a program control section comprising an instruction memory in which a microprogram describing how a test pattern is to be generated is loaded, means for reading the microprogram from the memory and for interpretation and execution of the microprogram, means for issuing an address pattern generate instruction, a data pattern generate instruction, a memory control instruction a status information select instruction and a buffer memory select instruction, and means for receiving status information to control the order of execution of the microprogram;

an address pattern generation section connected to the program control section and comprising means for receiving the address pattern generate instruction and for performing an arithmetic operation in response to the instruction to generate an address;

a data pattern generation section connected to the program control section and comprising means for receiving the data pattern generate instruction and for performing an arithmetic operation in response to the instruction to generate a data pattern, said address and data pattern generation sections comprising means for being driven by a common operation clock;

a memory control signal generation section connected to the program control section and comprising means for receiving the memory control instruction to generate a memory control signal;

a status information generation section connected to the program control section and comprising means for receiving the status information select instruction and a plurality of data from the components of the generating apparatus, including at least the address pattern from the address pattern generation section and means for comparing the two data and for providing the result of the comparison as the status information to the program control section in response to the status information select information;

a buffer memory section comprising means for storing a plurality of sets of an address pattern, a data pattern and a memory control signal, means for receiving the buffer memory select instruction from the program control section and for initiating reading of the stored data by the common operation clock of the address pattern generation section and the data pattern generation section, the buffer memory section generating a buffer memory operation signal during the readout operation;

an address select circuit comprising means for receiving the address pattern from the address pattern generation section and the address pattern from the buffer memory section and for selecting one of the address patterns under the control of the buffer memory operation signal;

a data select circuit comprising means for receiving the data pattern from the data pattern from generation section and the data pattern the buffer memory section and for selecting one of the data patterns under the control of the buffer memory operation signal;

a memory control signal select circuit comprising means for receiving the memory control signal from the memory control signal generation section and the memory control signal from the buffer memory section and for selecting one of the memory control signals under the control of the buffer memory operation signal; and means for stopping the operations of the program control section, the address pattern generation section and the data pattern generation section by the buffer memory operation signal.

11. A test pattern generating apparatus according to claim 10, wherein the buffer memory section includes an area storage part for storing area information indicating at least one memory area of the buffer memory section that is to be continuously read.

12. A test pattern generating apparatus according to claim 11, wherein the area storage part comprises means for storing area information indicating a plurality of different memory areas and means for selecting the area information of a selected memory area of the buffer memory section by an area select signal from the program control section.

13. A test pattern generating apparatus comprising:
a program control section comprising an instruction memory into which a microprogram describing a test pattern to be generated is loaded, means for reading the microprogram from the instruction memory, for interpretation and execution, and for issuing an address pattern generate instruction, a data pattern generate instruction, a memory control instruction and a status information select instruction, and means for receiving status information to control the order of execution of the microprogram;

an address pattern generation section connected to the program control section and comprising means for receiving the address pattern generate instruction and for performing an arithmetic operation in response to the instruction to generate an address pattern;

a data pattern generating section connected to the program control section and comprising means for receiving the data pattern generate instruction and for performing an arithmetic operation in response to the instruction to generate a data pattern;

a memory control signal generation section connected to the program control section and comprising means for receiving the memory control instruction to generate a memory control signal;

a status information generation section connected to the program control section and comprising means for receiving the status information select instruction and a plurality of data from selected components of said generating apparatus including at least the address pattern from the address pattern generation section and means for comparing the two data and for providing the result of the comparison as the status information to the program control section in response to the status information select information; and a trigger circuit section which comprises an address detector having means for producing an output upon coincidence of the address pattern from the address pattern generation section with a specified address pattern, a data detector having means for producing an output upon coincidence of the data pattern from the data pattern generation section with a specified data pattern, a selector having as inputs said outputs and means for selecting a particular one of the outputs from the address detector, the data detector and the memory control signal from the memory control signal generation section, and a counter for counting the frequency of occurrence of the selected output.

14. A test pattern generating apparatus according to claim 13, wherein the selector comprises means for selecting a plurality of its inputs and for providing a selected logic function of the selected inputs.

15. A test pattern generating apparatus comprising:
a program control section comprising an instruction memory into which a microprogram describing a test pattern to be generated is loaded, means for reading the microprogram from the instruction memory for interpretation and execution and for issuing an address pattern generate instruction, a data pattern generate instruction, a memory control instruction and a status information select instruction, and means for receiving status information to control the order of execution of the microprogram;

an address pattern generation section connected to the program control section and comprising means for receiving the address pattern generate instruction and for performing an arithmetic operation in response to the instruction to generate an address pattern;

a data pattern generating section connected to the program control and comprising means for receiving the data pattern generate instruction and for performing an arithmetic operation in response to the instruction to generate a data pattern;

a memory control signal generation section connected to the program control section and comprising means for receiving the memory control instruction and for generating a memory control signal;

a status information generation section connected to the program control section and comprising means for receiving the status information select instruction and a plurality of data including at least the address pattern from the address pattern generation section, for comparing the two data and for providing the result of the comparison as the status information to the program control section in response to the status information select information; and a breakpont control section which comprises a first address detector producing an output upon coincidence of the address pattern from the address pattern generation section with a first specified address pattern, a second address detector including means for receiving the address of the instruction memory of the program control section under execution to produce an output upon coincidence of the address with a second specified address, and means for producing a coincidence signal upon generation of the output from at least one of the first and second address detectors to stop the operation of the test pattern generating apparatus.

16. A test pattern generating apparatus according to claim 15, wherein the coincidence signal producing means comprises means for providing the coincidence signal upon detection of simultaneous generation of the outputs from the first and second address detectors.

17. A test pattern generating apparatus comprising:
a program control section comprising an instruction memory in which a microprogram describing a test pattern to be generated in loaded and means for reading the microprogram from the instruction memory for interpretation and execution and for issuing an address pattern generate instruction, a data pattern generate instruction, a memory control instruction and a status information select instruction, and means for receiving status information to control the order of execution of the microprogram;

an address pattern generation section connected to the program control section and comprising means for receiving the address pattern generate instruction and for performing an arithmetic operation in response to the instruction to generate an address pattern;

a data pattern generating section connecting to the program control section and comprising means for receiving the data pattern generate instruction and for performing an arithmetic operation in response to the instruction to generate a data pattern;

a memory control signal generation section connected to the program control section and comprising means for receiving the memory control instruction to generate a memory control signal;

a status information generation section connected to the program control section and comprising means for receiving the status information select instruction and a plurality of data including at least the address pattern from the address pattern generation section and means for comparing the two data and for providing the result of comparison as the status information to the program control section in response to the status information select information;

a plurality of registers selectively comprised in said program control section, address pattern generation section, data pattern generation section, memory control signal generation section and status information generation section; and an interface section connected to the input of said test pattern generating apparatus from said external control unit and comprising a separator for controlling connection and disconnection of data lines of the bus, a comparator for comparing data on the common bus on both sides of the separator, and a timing signal generator for generating a timing signal for disconnecting the separator according to a data transfer command from the external control unit during application of the data from the external control unit to the bus, a timing signal for reading to the bus data loaded in any one of said registers, and means for generating a timing signal for deriving an effective compared output from the comparator.

18. A test pattern generating apparatus comprising:

a program control section comprising an instruction memory in which a microprogram describing a test pattern to be generated is loaded and means for reading the microprogram from the instruction memory for interpretation and execution and for outputting an address pattern generate instruction, a data pattern generate instruction, a memory control instruction and a status information select instruction and means for receiving status information to control the order of execution of the microprogram;

an address pattern generation section connected to the program control section and comprising means for receiving the address pattern generate instruction and for performing an arithmetic operation in response to the instruction to generate an address pattern;

a data pattern generating section connected to the program control section and comprising means for receiving the data pattern generate instruction and for performing an arithmetic operation in response to the instruction to generate a data pattern;

a memory control signal generation section connected to the program control section and comprising means for receiving the memory control instruction to generate a memory control signal;

a status information generation section connected to the program control section and comprising means for receiving the status information select instruction and a plurality of data including at least the address pattern from the address pattern generation section, for comparing the two data and for providing the result of comparison as the status information to the program control section in response to the status information select information; and a page mode control section which comprises a comparator for comparing the row address in the address pattern from the address pattern generation section with the row address in the immediately preceding period, a switching circuit for outputting the row address and the column address in the address pattern alternately with each other in the current period in the case of the result of comparison by the comparator being non-coincidence and outputting only the column address in the case of the result of comparison being coincidence, and means for generating a signal for switching over the operation period of the test pattern generating apparatus upon detection of noncoincidence from the comparator.

19. A test pattern generating apparatus according to claim 18, wherein the page mode control section includes means for selectively simultaneously outputting the row and column addresses, and means for selectively switching between said simultaneous and said outputting from said switching circuit according to said non-coincidence signal.

20. A test pattern generating apparatus comprising:

a program control section comprising an instruction memory in which a microprogram describing a test pattern to be generated is loaded and means for reading the microprogram from the instruction memory for interpretation and execution for outputting an address pattern generate instruction, a data pattern generate instruction, a memory control instruction and a status information select instruction, and means for receiving status information to control the order of execution of the microprogram, said address pattern generate instruction comprising a row address generate instruction and a column address generate instruction;

an address pattern generation section which comprises a row address operating part connected to the program control section and comprising means for performing an arithmetic operation in response to the row address generate instruction in the address pattern generate instruction from the program control section to generate a row address pattern, a column address operating part comprising means for performing an arithmetic operation in response to the column address generate instruction in the address pattern generate instruction to generate a column address pattern, a register for loading a predetermined address, a comparator for comparing the content of the register with the row address supplied from the row address operating part, and means for accomplishing the arithmetic operation of the column address operating part by a coincidence output from the comparator to update the column address pattern;

a data pattern generating section connected to the program control section and comprising means for receiving the data pattern generate instruction to achieve an arithmetic operation in response to the instruction to generate a data pattern;

a memory control signal generation section connected to the program control section and comprising means for receiving the memory control instruction to generate a memory control signal; and a status information generation section connected to the program control section and comprising means for receiving the status information select instruction and a plurality of data including at least the address pattern from the address pattern generation section, for comparing the two data and for providing the result of comparison as the status information to the program control section in response to the status information select information.

21. The apparatus of claim 1, 9, 10, 13, 15, 18, or 20 comprising an interface timing generation section connected to the input of said test pattern generating apparatus, said interface section comprising a bilateral data buffer and a data comparator for comparing data on both sides of said bilateral data buffer that is transmitted through said interface timing generation section.

* * * * *

UNITED STATES PATENT AND TRADEMARK OFFICE
CERTIFICATE OF CORRECTION

PATENT NO. : 4,293,950

DATED : 6 October 1981

INVENTOR(S) : MASAO SHIMIZU et al

It is certified that error appears in the above-identified patent and that said Letters Patent is hereby corrected as shown below:

Col. 1, line 20, after "all" insert --at--;
line 59, after "to" insert --such a--;
at the end of the line delete "such";
line 60, delete "a complicatedly".
Col. 3, line 44, after "common" insert --external--;
line 55, after "so" insert --that--;
line 56, delete "that";
line 60, delete ",".
Col. 5, line 61, ":" should be --;--.
Col. 7, line 2, "above-said" should be --abovesaid--;
line 17, "is the" should be --is--;
after "of" insert --the--.
Col. 8, line 13, after "program" insert --to--;
line 38, delete "a";
line 57, "FIG. 4" should be --FIG. 3--.
Col. 9, line 27, "." should be --;--.
Col. 11, line 1, "or" should be --on--;
line 62, "multiplexers" should be --multiplexors--.

UNITED STATES PATENT AND TRADEMARK OFFICE
CERTIFICATE OF CORRECTION

PATENT NO. : 4,293,950
DATED : 6 October 1981
INVENTOR(S) : MASAO SHIMIZU et al

It is certified that error appears in the above-identified patent and that said Letters Patent is hereby corrected as shown below:

Col. 13, lines 10 and 16, "interpretted" should be --interpreted--.

Col. 14, line 19, after "loaded" insert --in--;
line 55, "is" should read -- in --.
line 56, after "26," insert --and--.

Col. 15, line 47, "sectin" should be --section--.

Col. 16, line 13, "generatin" should be --generation--;
line 51, delete "by".

Col. 17, lines 4 and 18, in "A+1" the "1" should be in regular type, not bold type.

Col. 18, lines 44 and 56, "99$_\ell$" should be --$99_1$--;
line 49, "101$_\ell$" should be --$101_1$--;
line 53, "102$_\ell$" should be --$102_1$--;
line 58, "104$_\ell$" should be --$104_1$--;
line 62, "logical" should be --logic--.

Col. 19, line 18, "Xa to Xd" should be --$\underline{Xa}$ to $\underline{Xd}$--;
line 19, "Ya to Yd" should be --$\underline{Ya}$ to $\underline{Yd}$--;
line 21, "Yb to Yc" should be --$\underline{Yb}$ to $\underline{Yc}$--;
lines 41 and 42, the last term of the expression should have a line over it $$(\overline{Yb \leq Y \leq Yc}).$$

UNITED STATES PATENT AND TRADEMARK OFFICE
CERTIFICATE OF CORRECTION

PATENT NO. : 4,293,950
DATED : 6 October 1981
INVENTOR(S) : MASAO SHIMIZU et al

Page 3 of 4

It is certified that error appears in the above—identified patent and that said Letters Patent is hereby corrected as shown below:

Col. 21, line 2, "136" should be --135--.
Col. 23, line 39, "21 c" should be --21c--.
Col. 24, line 22, "computer" should be --comparator--;
    line 27, "non-coincide" should be --non-coincidence--.
Col. 25, line 19, after "nately" insert --applied--; delete "other";
    line 25, delete "switched over to";
    line 38, "operation" should be --calculation--.
Col. 26, line 3, "noncoincidence" should be --non-coincidence--;
    line 11, "control" should be --circuit--;
    line 24, "at" should be --to--;
    line 56, "ofof" should be --of--.
Col. 27, line 2, "direction" should be --directing--;
    line 3, after "result" insert --of--;
    line 17, delete "number of";
    line 18, change "operations" to --operand--;
    line 58, after "terminal" insert --29x--.

UNITED STATES PATENT AND TRADEMARK OFFICE
CERTIFICATE OF CORRECTION

PATENT NO. : 4,293,950

DATED : 6 October 1981

Page 4 of 4

INVENTOR(S) : MASAO SHIMIZU et al

It is certified that error appears in the above—identified patent and that said Letters Patent is hereby corrected as shown below:

```
Col. 28, line 17, "203" (second occurrence) should be
        --205--;
        line 64, after "namely" insert --,--.  Col. 30, line
27, after "and", second occurrence, insert -- a logic --.
Col. 31, line 62, after "instruction" insert --,--.
Col. 32, line 44, delete "from" (seond occurrence);
        line 45, after "pattern" insert --from--.
Col. 34, line 29, "breakpont" should be --breakpoint--;
        line 51, "in" should be --is--.
```

Signed and Sealed this

Twenty-seventh Day of April 1982

[SEAL]

Attest:

GERALD J. MOSSINGHOFF

Attesting Officer

Commissioner of Patents and Trademarks